(12) United States Patent
Yoshida

(10) Patent No.: US 10,725,354 B2
(45) Date of Patent: Jul. 28, 2020

(54) WIRING SUBSTRATE AND DISPLAY DEVICE

(71) Applicant: Sharp Kabushiki Kaisha, Sakai, Osaka (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/489,036

(22) PCT Filed: Feb. 21, 2018

(86) PCT No.: PCT/JP2018/006127
§ 371 (c)(1),
(2) Date: Aug. 27, 2019

(87) PCT Pub. No.: WO2018/159395
PCT Pub. Date: Sep. 7, 2018

(65) Prior Publication Data
US 2020/0004090 A1 Jan. 2, 2020

(30) Foreign Application Priority Data
Feb. 28, 2017 (JP) ................................. 2017-036248

(51) Int. Cl.
*G09G 3/36* (2006.01)
*G02F 1/1362* (2006.01)
(Continued)

(52) U.S. Cl.
CPC ...... *G02F 1/136204* (2013.01); *G02F 1/1309* (2013.01); *G02F 1/1339* (2013.01);
(Continued)

(58) Field of Classification Search
CPC ... G09G 3/36; G09G 5/00; G09G 5/08; G06F 3/038; G06F 3/02
See application file for complete search history.

(56) References Cited

U.S. PATENT DOCUMENTS 6,856,374 B1    2/2005  Ozaki et al.
8,994,682 B2 *  3/2015  Hashimoto ........... G06F 3/0418
                                              345/173
(Continued)

FOREIGN PATENT DOCUMENTS

JP    2001-147649 A    5/2001

*Primary Examiner* — Pegeman Karimi
(74) *Attorney, Agent, or Firm* — Keating & Bennett, LLP

(57) ABSTRACT

A wiring substrate includes a first conductive film, a second conductive film disposed over the first conductive film with a first insulating film therebetween, a third conductive film disposed over the second conductive film, at a side away from the first conductive film, with a second insulating film therebetween, signal lines formed of the third conductive film, leading lines each having a first end portion connected to the signal line and a second end portion through which a signal to the signal line enters, the first and second end portions of the leading lines at least being formed of the third conductive film, and a spare line including at least first and second line overlapping portions, respectively, overlapping the first and second end portions of the leading lines, the first and second line overlapping portions being formed of the first conductive film and allow electrically connection to each other.

15 Claims, 12 Drawing Sheets

(51) Int. Cl.
  *G06F 3/044*    (2006.01)
  *G02F 1/13*    (2006.01)
  *G02F 1/1333*    (2006.01)
  *G02F 1/1339*    (2006.01)
  *G02F 1/1345*    (2006.01)
  *G02F 1/1368*    (2006.01)
  *G06F 3/041*    (2006.01)
  *H01L 27/12*    (2006.01)

(52) U.S. Cl.
  CPC ........ *G02F 1/1368* (2013.01); *G02F 1/13338* (2013.01); *G02F 1/13452* (2013.01); *G02F 1/136286* (2013.01); *G06F 3/0412* (2013.01); *G06F 3/0446* (2019.05); *H01L 27/1244* (2013.01)

(56) References Cited

U.S. PATENT DOCUMENTS

2003/0052867 A1* 3/2003 Shigetaka ............... G06F 3/044
  345/173
2005/0078235 A1* 4/2005 Ozaki ............... G02F 1/136259
  349/55
2007/0013856 A1* 1/2007 Watanabe ........... G02F 1/13452
  349/150
2007/0236618 A1* 10/2007 Maag ..................... G06F 3/044
  349/12

\* cited by examiner

WIRING SUBSTRATE AND DISPLAY DEVICE

TECHNICAL FIELD

The present invention relates to a wiring substrate and a display device.

BACKGROUND ART

Patent Document 1 listed below describes a known example of a method of repairing a defect in a display device including a substrate with pixel regions. The method of repairing a defect in a display device including a substrate with pixel regions includes the step of applying a laser beam to a multi-layer region where multiple conductive layers are stacked on top of another with an insulating layer therebetween to selectively remove only an upper conductive layer around the multi-layer region such that neither interlayer short-circuit nor same-layer short-circuit occurs in the multi-layer region. Furthermore, the display device in Patent Document 1, which includes multiple bus lines in a display area, includes a repairing line that allow connection to leading lines extending from the display area to terminals of the bus lines. The repairing line repairs disconnection of the leading lines.

RELATED ART DOCUMENT

Patent Document

Patent Document 1: Japanese Unexamined Patent Application Publication No. 2001-147649

Problem to be Solved by the Invention

The repairing line included in the display device described in Patent Document 1 is formed of a metal that forms the gate bus lines disposed below drain bus lines, which are repairing targets, with an insulating film therebetween. The repairing line intersects the multiple drain bus lines, and thus parasitic capacitance exists between the repairing line and the drain bus lines. This excessively increases load to the drain bus lines connected to the repairing line, leading to signal distortion, for example, which may cause a display defect.

DISCLOSURE OF THE PRESENT INVENTION

The present invention was made in view of the above-described circumstance. An object is to reduce load to the signal lines.

Means for Solving the Problem

A wiring substrate according to the present invention includes a first conductive film, a second conductive film disposed over the first conductive film with a first insulating film therebetween, a third conductive film disposed over the second conductive film, at a side away from the first conductive film, with a second insulating film therebetween, signal lines formed of the third conductive film, leading lines each having a first end portion connected to the signal line and a second end portion through which a signal to the signal line enters, the first and second end portions of the leading lines at least being formed of the third conductive film, and a spare line including at least first and second line overlapping portions overlapping the first and second end portions of the leading lines, the first and second line overlapping portions being formed of the first conductive film and allow electrically connection to each other.

In this configuration, the signal inputted to the second end portion of the leading line is sent through the leading line to the signal line connected to the first end portion of the leading line. If any one of the leading lines has a defect such as disconnection, the end portions of the defective leading line are short-circuited to the overlapping line overlapping portions of the spare line by laser irradiation, for example, and the line overlapping portions are electrically connected to each other such that the signal is sent to the signal line through the spare line.

Here, if the line overlapping portions of the spare line are formed of the second conductive film, distortion may be caused in a signal sent to the spare line due to parasitic capacitance between the end portions of the leading line not to be short-circuited to the spare line and the line overlapping portions, leading to an increase in load to the signal lines. However, since the spare line has the line overlapping portions formed of the first conductive film, the first and second insulating films are located between the end portions of the leading line, which are formed of the third conductive film, and the line overlapping portions. This reduces parasitic capacitance between the end portions of the leading line not to be short-circuited to the spare line and the line overlapping portions, and thus distortion is less likely to be caused in a signal sent to the spare line. This reduces load to the signal line.

The following are preferable configurations of the present invention.

(1) The wiring substrate includes an inter-line pad overlapping the first and second end portions of the leading lines and the first and second line overlapping portions of the spare line. The inter-line pad is formed of the second conductive film. In this configuration, if the leading line has a defect such as disconnection, the end portions of the leading line are short-circuited to the overlapping inter-line pad and the line overlapping portions of the spare line are short-circuited to the overlapping inter-line pad. In this way, the leading line formed of the third conductive film and the spare line formed of the first conductive film are electrically connected to each other via the inter-layer pad formed of the second conductive film. This configuration has higher connection reliability than a configuration in which the end portions are directly short-circuited to the line overlapping portions.

(2) The inter-line pad has leading line overlapping portions overlapping the first and second end portions of the leading lines and spare line overlapping portions overlapping the first and second line overlapping portions of the spare line. With this configuration, if the leading line has a defect such as disconnection, the end portions of the leading line are short-circuited to the overlapping leading line overlapping portion and the line overlapping portions of the spare line are short-circuited to the overlapping spare line overlapping portion. Thus, this configuration has higher short circuit reliability than a configuration in which the inter-line pad is disposed over the overlapping portion where the end portions of the leading line and the line overlapping portions overlap.

(3) The spare line overlapping portion of the inter-line pad overlaps the first and second end portions of the leading lines and the leading line overlapping portion thereof does not overlap the first and second line overlapping portions of the spare line. This configuration requires a smaller arrangement space for the inter-line pad than a configuration in which the spare line overlapping portion does not overlap the end portions of the source leading line.

(4) The wiring substrate includes a fourth conductive film disposed over the third conductive film, at a side away from the second conductive film, with a third insulating film therebetween, a transparent electrode film disposed over the fourth conductive film, at a side away from the third conductive film, with a fourth insulating film therebetween, a position detection electrode configured to form capacitance with a position input body that inputs a position to enable detection of a position inputted by the position input body, the position detection electrode being formed of the transparent electrode film, position detection lines extending along the signal lines and connected to the position detection electrode through contact holes at least in the fourth insulating film, the position detection lines being formed of the fourth conductive film, and position detection leading lines each having a first end portion connected to the position detection line and a second end portion through which a signal to the position detection line enters, the first and second end portions of the position detection leading lines being at least formed of at least one of the third conductive film and the fourth conductive film. The first and second line overlapping portions of the spare line, respectively, overlap the first and second end portions of the detection leading lines. In this configuration, the signal inputted to the position detection leading line through the second end portion is sent through the position detection leading line to the position detection line connected to the first end portion of the position detection leading line. The position detection electrode generates capacitance with the position input body that inputs a position, and thus the position inputted by the position input body is detected by using the signal supplied by the position detection line. If any one of the position detection leading lines has a defect such as disconnection, the end portions of the defective position detection leading line are short-circuited to the overlapping line overlapping portions of the spare line by laser irradiation, for example, and the line overlapping portions are electrically connected to each other such that the signal is sent to the position detection line through the spare line. In this configuration, since the line overlapping portions of the spare line, which are formed of the first conductive film, overlap the end portions of the position detection leading line, which are formed of at least one of the third conductive film and the fourth conductive film, at least the first insulating film and the second insulating film are located between the end portions of the position detection leading line and the line overlapping portions. This reduces parasitic capacitance between the end portions of the position detection leading line not to be short-circuited to the spare line and the line overlapping portions of the spare line. Thus, distortion is less likely to be caused in the signal sent to the spare line, reducing load to the position detection line.

(5) The first and second line overlapping portions of the spare line each include divided line overlapping portions covering different sets of the leading lines as short-circuit targets. The divided line overlapping portions that overlap the first end portions of the leading lines allow electrically connection to the corresponding divided line overlapping portions that overlap the second end portions of the leading lines. In this configuration, the number of leading lines not to be short-circuited to the divided line overlapping portions is small compared with that in a configuration in which the line overlapping portions are not divided into sections, reducing parasitic capacitance generated between the leading lines not to be short-circuited and the divided line overlapping portions. This reduces load to the signal line.

(6) The leading lines each have a middle portion not overlapping the spare line and the middle portion is formed of any one of the first conductive film, the second conductive film, and the third conductive film. The middle portions of the leading lines located next to each other are formed of different conductive films. The distance between the middle portions of the source leading lines located next to each other is small in some cases. In such cases, this configuration prevents short circuit between the leading lines, because the adjacent middle portions are formed of different two of the first, second, and third conductive films. This is advantageous for higher definition and a smaller frame width.

(7) The second end portions of the leading lines each include a terminal through which a signal enters, and the terminal is formed of the second conductive film. This allows the middle portion of the leading line to be formed of any one of the first, second, and third conductive films to achieve easy connection to the source terminal formed of the second metal film.

(8) The wiring substrate includes an inspection circuit for inspecting the signal lines. The second end portions of the signal lines each include a terminal through which a signal enters and an inspection circuit connecting portion extending from the terminal to a side away from the signal line and connected to the inspection circuit. In this configuration, an inspection of the signal line is performed by supplying an inspection signal from the inspection circuit to the second end portion of the leading line. The inspection signal is sent to the signal line through the inspection circuit connecting portion and the terminal included in the second end portion of the source leading line. Thus, the entire leading line is inspected in addition to the signal line.

(9) The wiring substrate includes a driver overlapping the terminals and connected to the terminals. The inspection circuit overlaps the driver. In this configuration, the inspection circuit is disposed in the mounting area of the driver. This is advantageous for higher definition and smaller frame width.

(10) The spare line includes an overlap-to-overlap connecting portion extending from one of the first and second line overlapping portions to the other and formed of the first conductive film. In this configuration, since the first and second line overlapping portions formed of the first conductive film are continuous with the overlap-to-overlap connecting portion formed of the same first conductive film, the leading line is connected to the spare line by short-circuiting the end portions to the line overlapping portions by laser irradiation, for example. This configuration has high work efficiency compared with a configuration in which the overlap-to-overlap connecting portion is formed of the second conductive film or the third conductive film.

(11) The first and second line overlapping portions of the spare line each include divided line overlapping portions covering different sets of the leading lines as short-circuit targets. The spare line includes an overlap-to-overlap connecting portion formed of the second conductive film or the third conductive film and partly overlapping the divided line overlapping portions that overlap the first end portions of the leading lines and the divided line overlapping portions that overlap the second end portions of the leading lines. In this configuration, to connect the leading line to the spare line, the end portions are short-circuited to the divided line overlapping portions of the line overlapping portions by laser irradiation, for example, and the divided line overlapping portions formed of the first conductive film are short-circuited to the overlap-to-overlap connecting portion formed of the second conductive film or the third conductive film by laser irradiation, for example. This configuration requires the smaller number of overlap-to-overlap connecting portions and the smaller arrangement space for overlap-to-overlap connecting portions than a configuration in which the overlap-to-overlap connecting portion is formed of the first conductive film and the number of overlap-to-overlap connecting portions is required to be the same as that of the divided line overlapping portions. This configuration is advantageous for higher definition and a smaller frame width.

(12) The second end portions of the leading lines each include a terminal through which a signal enters and an extended portion extending from the terminal to a side away from the signal line. The extended portions of the leading lines that are located relatively close to the overlap-to-overlap connecting portion are shorter than the extended portions of the leading lines that are located relatively away from the overlap-to-overlap connecting portion. The divided line overlapping portions of the spare line include a divided line overlapping portion selectively overlapping the shorter extended portions and a divided line overlapping portion selectively overlapping the longer extended portions. In this configuration, the leading lines that are located relatively close to the overlap-to-overlap connecting portion have the shorter extended portions, which extend from the terminals to a side away from the signal lines, than the leading lines that are located relatively away from the overlap-to-overlap connecting portion. This prevents the divided line overlapping portions overlapping the shorter extended portions from overlapping the longer extended portions and also prevents the divided line overlapping portions overlapping the longer extended portions from overlapping the shorter extended portions. This configuration reduces parasitic capacitance between the leading lines that are not covered as short-circuit targets and the divided line overlapping portion, reducing load to the signal lines.

(13) The divided line overlapping portions of the spare line include a divided line overlapping portion that covers the first end portions of the leading lines that are located relatively away from the overlap-to-overlap connecting portion as short-circuit targets. The divided line overlapping portion has a first section having overlapping portions overlapping the first end portions of the leading lines that are covered as the short-circuit targets and a second section having overlapping portions overlapping the first end portions of the leading lines that are located relatively close to the overlap-to-overlap connecting portion. The overlapping portions of the second section have a smaller width than the overlapping portions of the first section. In this configuration, although the first divided line overlapping portion that covers the first end portions of the leading lines that are located relatively away from the overlap-to-overlap connecting portion as the short-circuit targets overlaps the first end portions of the leading lines that are located relatively close to the overlap-to-overlap connecting portion, the overlapping portions have a width smaller than the overlapping portions overlapping the first end portions of the leading lines that are covered as short-circuit targets. This reduces parasitic capacitance between the leading lines not to be short-circuited and the divided line overlapping portion. This further reduces load to the signal lines.

Next, to solve the above-described problem, a display device according to the present invention includes the above-described wiring substrate, a counter substrate having a plate surface facing a plate surface of the wiring substrate with a space therebetween, and a sealing portion disposed between the wiring substrate and the counter substrate and surrounding the space. The leading lines at least partly overlap the sealing portion. In this configuration, the sealing portion between the wiring substrate and the counter substrate surrounds the inner space to seal the inner space. When the sealing portion is formed of a photocurable resin material, for example, light for curing the photocurable resin material may be applied from the side of the wiring substrate. In such a case, the leading line, which at least partly overlap the sealing portion, is desired to have a smaller width to allow more curing light to pass. Although such a configuration is more likely to allow a defect such as disconnection to occur, the defective leading line is able to be repaired by being short-circuited to the spare line.

Advantageous Effect of the Invention

According to the present invention, load to signal lines is reduced.

MODES FOR CARRYING OUT THE INVENTION

First Embodiment

Figure 1:
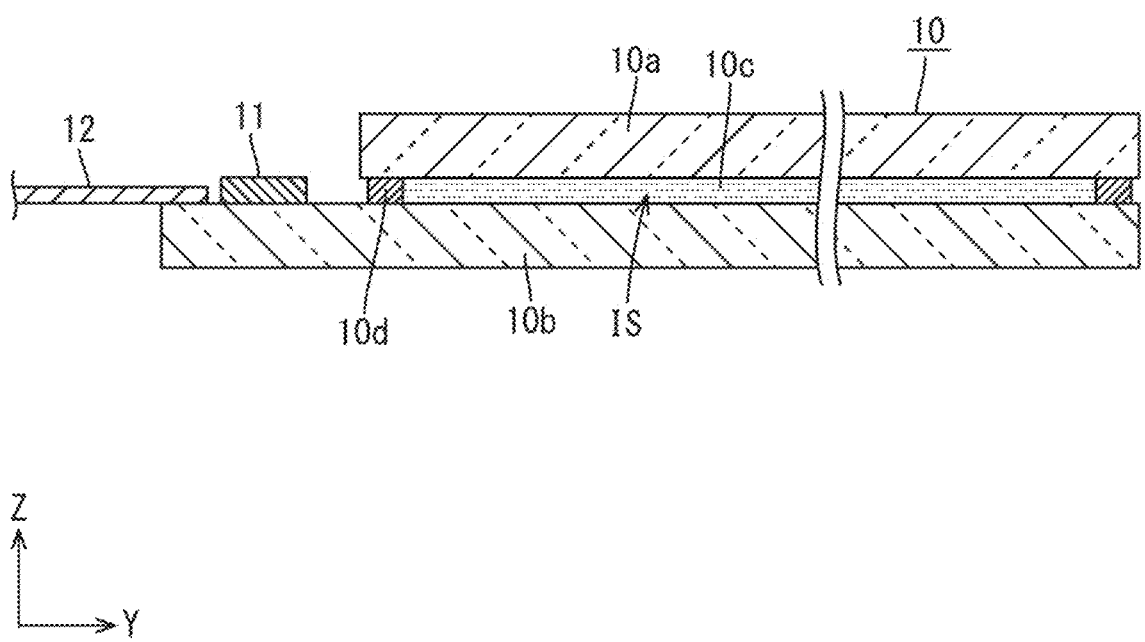
FIG. 1 is a cross-sectional view schematically illustrating a liquid crystal panel according to a first embodiment of the invention.

A first embodiment of the invention is described with reference to FIG. 1 to FIG. 8. In this embodiment, a liquid crystal panel 10 (display device, display device having a position input function) having a touch panel function (position input function) in addition to a display function is described as an example. The X axis, the Y axis, and the Z axis are indicated in some of the drawings, and each of the axes indicates the same direction in the respective drawings. Furthermore, the up and down direction is based on FIG. 1. The upper side in FIG. 1 is the front side and the lower side in FIG. 1 is the rear side.

Figure 2:
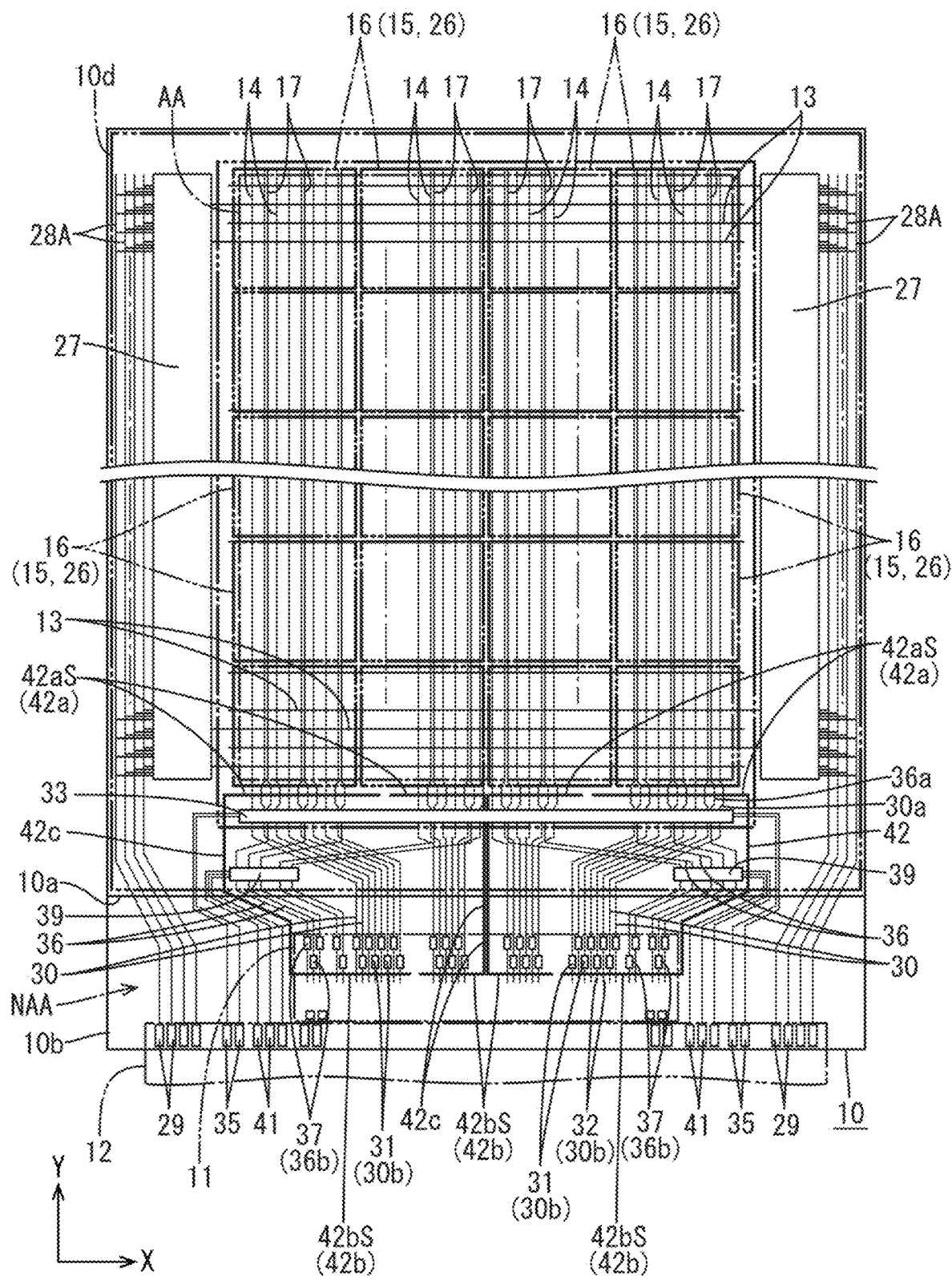
FIG. 2 is a plan view schematically illustrating a wiring configuration of an array substrate included in the liquid crystal panel.

The liquid crystal panel 10 displays an image by using light from a backlight device (lighting device) (not illustrated). As illustrated in FIG. 1, the liquid crystal panel 10 at least includes two substantially transparent glass substrates 10a and 10b having high light transmitting properties, a liquid crystal layer 10c disposed in an inner space IS between opposing plate surfaces of the substrates 10a and 10b and containing liquid crystal molecules, which are substances whose optical properties are changed by application of an electrical field, and a sealing portion 10d disposed between the substrates 10a and 10b surrounding the inner space IS to seal the inner space IS and the liquid crystal layer 10c. One of the substrates 10a and 10b of the liquid crystal panel 10 on the front (front surface) side is a CF substrate (counter substrate) 10a and the other on the rear (rear surface) side is an array substrate (wiring substrate, active matrix substrate) 10b. The CF substrate 10a and the array substrate 10b each include a glass substrate and various films laminated on an inner surface of the glass substrate. The sealing portion 10d is formed of a photocurable resin material such as a UV curable resin material, for example. Furthermore, the substrates 10a and 10b each have a polarizing plate (not illustrated) on the outer surface. In FIG. 2, a formation area of the sealing portion 10d is indicated by a two-dot chain line.

Figure 3:
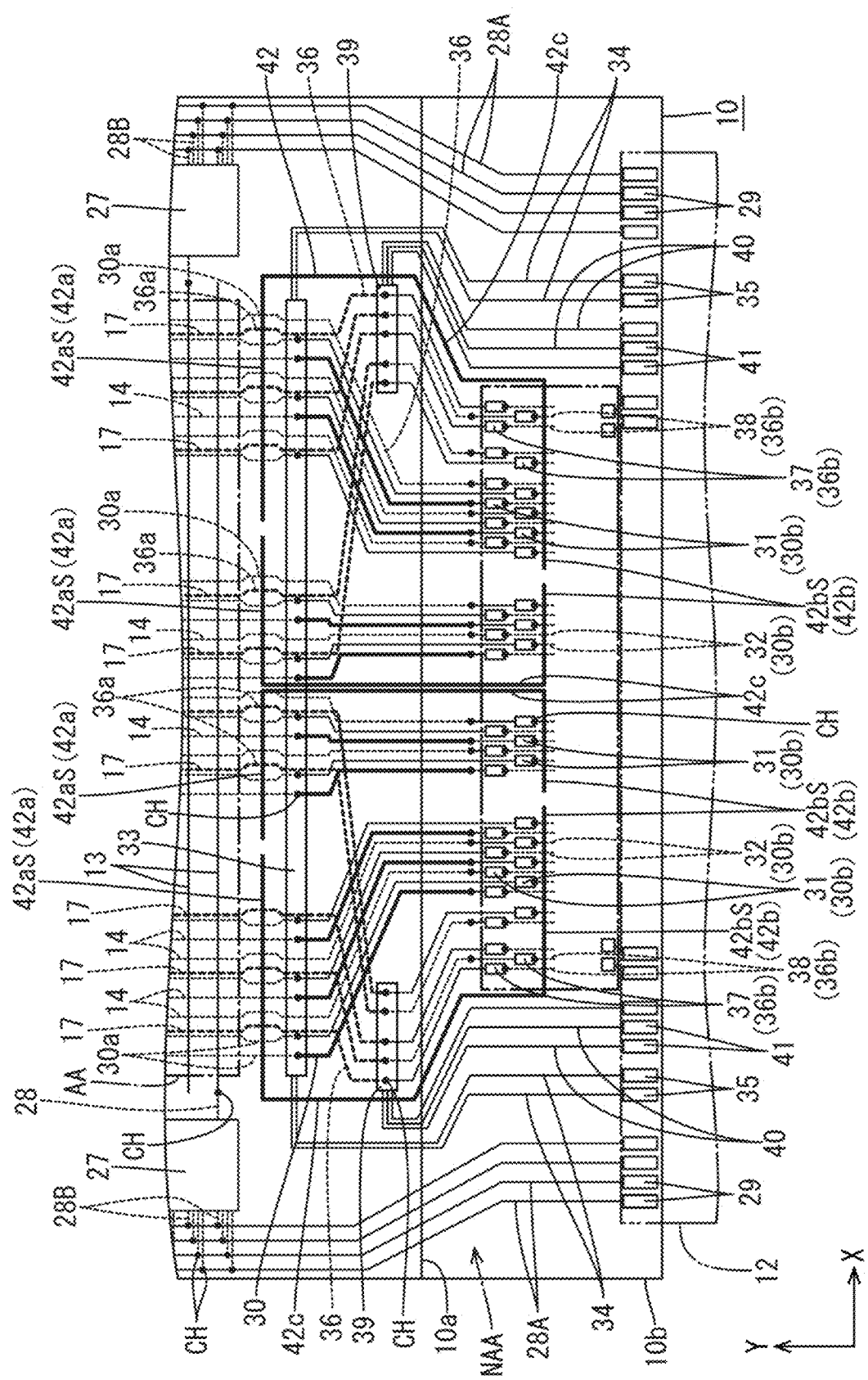
FIG. 3 is a plan view schematically illustrating a wiring configuration in a non-display area of the array substrate.
Figure 4:
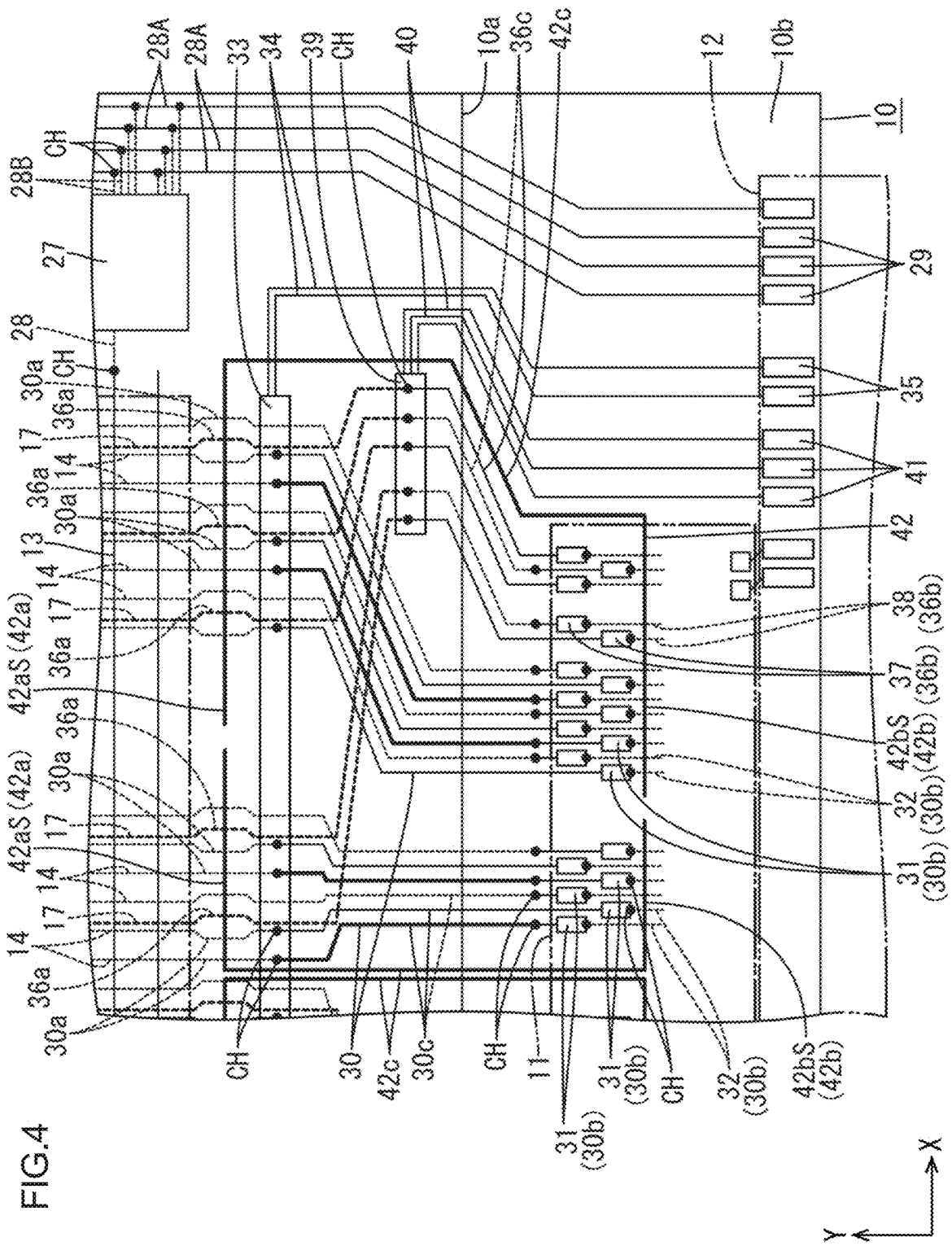
FIG. 4 is a magnified plan view of a right portion in FIG. 3.

As illustrated in FIG. 2, the middle portion of the liquid crystal panel 10 is a display area (area surrounded by a one-dot chain line in FIG. 2) AA capable of displaying an image and the frame-like outer peripheral portion surrounding the display area AA is a non-display area NAA incapable of displaying an image. The array substrate 10b of the liquid crystal panel 10 is larger than the CF substrate 10a and has a portion protruding horizontally from the CF substrate 10a. Components such as a driver (panel driving member) 11 and a flexible board (signal transmitting member) 12, which are used to supply various signals for a display function and a touch panel function, are mounted on the protruding portion (non-display area NAA). The driver 11 that includes an LSI chip having a driving circuit therein is mounted on the protruding portion of the array substrate 10b, which is the non-display area NAA (at a position away from the flexible board 12 toward the display area AA), by using chip on glass (COG) technology. The driver 11 processes various signals sent from the flexible board 12. The flexible board 12 includes a base formed of an insulating and flexible synthetic resin material (polyimide resin, for example) and multiple wiring patterns (not illustrated) on the base. The flexible board 12 is connected to the protruding portion of the array substrate 10b (to an end of the protruding portion such that the driver 11 is located between the flexible board 12 and the display area AA) at a first end and to a control board (signal supply) (not illustrated) at a second end. Various signals, which are fed from the control board toward the liquid crystal panel 10 through the flexible board 12, are output to the display area AA after being processed by the driver 11 in the non-display area NAA. In FIG. 2 to FIG. 4, outlines of the driver 11 and the flexible board 12 are indicated by two-dot chain lines.

As illustrated in FIG. 2, multiple gate lines (scanning lines) 13 and multiple source lines (signal lines, date lines) 14 are disposed in a grid pattern on the inner surface (surface adjacent to the liquid crystal layer 10c, surface facing the CF substrate 10a) of the array substrate 10b over the display area AA. TFTs (not illustrated), which are switching devices, and pixel electrodes (not illustrated) are disposed near the intersections of the lines. The gate lines 13 extend in the X axis direction across the display area AA and are connected to gate electrodes of the TFTs. The source lines 14 extend in the Y axis direction across the display area AA and are connected to source electrodes of the TFTs. The gate lines 13 are spaced apart from each other in the Y axis direction. The source lines 14 are spaced apart from each other in the X axis direction. The TFTs and the pixel electrodes are arranged in the X axis direction and the Y axis direction in a matrix (rows and columns) in a plan view. The pixel electrodes are connected to drain electrodes of the TFTs. The TFT is driven in response to a scanning signal supplied to the gate line 13, and the pixel electrode is charged to a potential corresponding to the image signal (signal, data signal) to be supplied to the source line 14 when the TFT is driven.

As illustrated in FIG. 2, a common electrode 15 is disposed on the inner surface of the array substrate 10b over the display area AA. The common electrode 15, which is disposed over substantially the entire display area AA, is located above the pixel electrodes (closer to the liquid crystal layer 10c) and overlaps all the pixel electrodes. In FIG. 2, the common electrode 15 is indicated by a two-dot chain line. The common electrode 15 has openings (not illustrated) for aligning the liquid crystal molecules in the liquid crystal layer 10c at positions overlapping the pixel electrodes. The common electrode 15 has a substantially constant referential potential at least for a displaying time. A potential difference is caused between the common electrode 15 and the pixel electrodes depending on a potential of the charged pixel electrodes. The electric field generated based on the potential difference includes a fringe electric field (oblique electric field) containing components normal to the plate surface of the array substrate 10b in addition to components parallel to the plate surface of the array substrate 10b. Thus, the liquid crystal panel 10 operates in a fringe field switching (FFS) mode, in which a fringe electric field is used to control the alignment of the liquid crystal molecules in the liquid crystal layer 10c. Although not illustrated, red (R), green (G), and blue (B) color filters overlapping the pixel electrodes and light-blocking portions (black matrix) located between the adjacent color filters, for example, are disposed on the inner surface of the CF substrate 10a over the display area AA.

The liquid crystal panel 10 of the embodiment has a display function of displaying an image and a touch panel function (position input function) of detecting a position (input position) touched by a user based on the displayed image. The liquid crystal panel 10 integrally includes a (in-cell) touch panel pattern for the touch panel function. The touch panel pattern is a projected capacitive touch panel pattern and employs self-capacitive detection, for example. As illustrated in FIG. 2, the touch panel pattern is disposed on the array substrate 10b, which is one of the substrates 10a and 10b, and includes multiple touch electrodes (position detection electrodes) 16 arranged in a matrix on the plate surface of the array substrate 10b. The touch electrodes 16 are disposed over the display area AA of the array substrate 10b. The display area AA of the liquid crystal panel 10 substantially matches a touch area (position input area) where the input position is detectable and the non-display area NAA substantially matches a non-touch area (non-position input area) where the input position is undetectable.

When a user moves his/her finger (position input body) (not illustrated), which is a conductor, toward the surface (display surface) of the liquid crystal panel 10 to input a position based on an image in the display area AA of the liquid crystal panel 10, capacitance is generated between the finger and the touch electrode 16. The capacitance detected at the touch electrode 16 near the finger changes as the finger approaches, and the touch electrode 16 become distinguishable from the other touch electrodes 16 away from the finger, enabling the detection of the input position.

As illustrated in FIG. 2, the touch electrodes 16 are formed by the common electrode 15 on the array substrate 10b. The common electrode 15 has a partition opening in a grid pattern in plan view and the partition opening divides the common electrode 15 into a grid form to form the touch electrodes 16 electrically independent from each other. The touch electrodes 16 are arranged in the X axis direction and the Y axis direction in a matrix over the display area AA. The touch electrodes 16 each has a square shape in plan view and the length of each side is about few millimeters (about 2 to 4 mm, for example). The touch electrode 16 is much larger than the pixel electrode (pixel) in plan view and extends in the X axis direction and the Y axis direction over multiple (about tens or hundreds, for example) pixel electrodes. Multiple touch lines (position detection lines) 17 on the array substrate 10b are selectively connected to the touch electrodes 16. The touch lines 17 extend along the source line 14 in the Y direction on the array substrate 10b and are selectively connected to the predetermined touch electrodes 16 arranged in the Y axis direction. Furthermore, the touch lines 17 are connected to a detection circuit (not illustrated). The detection circuit may be included in the driver 11 or may be disposed in an external device located outside the liquid crystal panel 10 via the flexible board 12. The touch line 17 sends a reference potential signal for the display function and a touch signal (position detection signal, signal) for the touch function to the touch electrode 16 at different timings. The reference potential signals are sent to all the touch lines 17 at the same timing such that all the touch electrodes 16 have the reference potential and function as the common electrode 15. FIG. 2 only schematically illustrates the arrangement of the touch electrodes 16. The number or the arrangement of the touch electrodes 16 may be suitably changed from those in FIG. 2.

Figure 6:
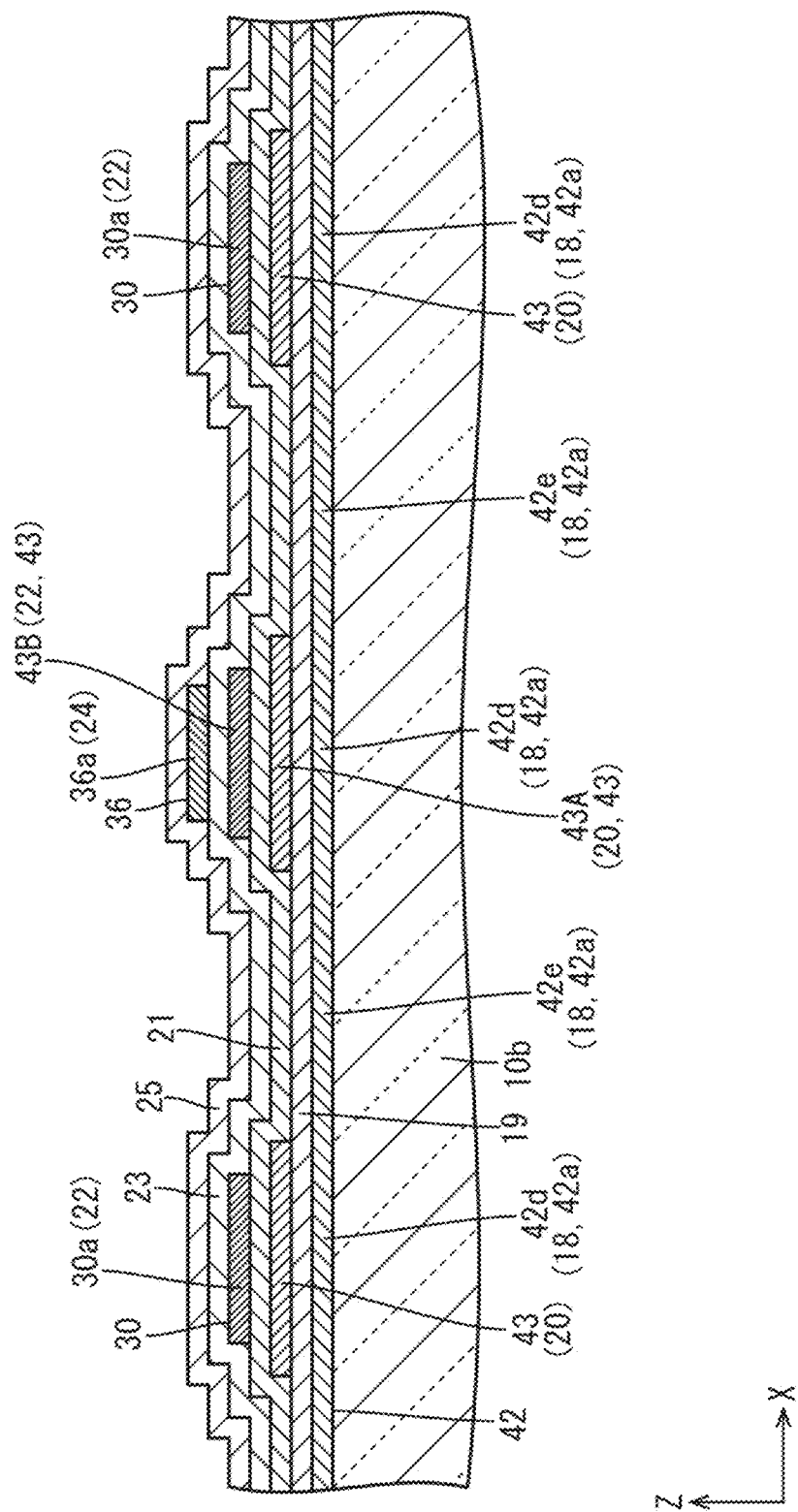
FIG. 6 is a cross-sectional view taken along line A-A in FIG. 5.

Here, various films laminated on the inner surface of the array substrate 10b are described. As illustrated in FIG. 6, the films laminated on the glass substrate of the array substrate 10b include, in this order from the lowest layer (adjacent to the glass substrate), a first metal film (first conductive film) 18, a first interlayer insulating film (first insulating film) 19, a second metal film (second conductive film, gate metal film) 20, a second interlayer insulating film (second insulating film, gate insulating film) 21, a semiconducting film (not illustrated), a third metal film (third conductive film, source metal film) 22, a third interlayer insulating film (third insulating film) 23, a fourth metal film (fourth conductive film) 24, a fourth interlayer film (fourth insulating film) 25, a first transparent electrode film (not illustrated), a fifth interlayer insulating film (fifth insulating film, not illustrated), and a second transparent electrode film (transparent electrode film) 26. The second transparent electrode film 26, which is not illustrated in FIG. 6, is illustrated in FIG. 2.

Each of the first, second, third, and fourth metal films 18, 20, 22, and 24 is a single-layer film formed of one kind of metal material such as copper, titanium, and aluminum, or a multi-layer film or an alloy formed of different kinds of metal materials and thus has conductivity and light-blocking properties. The first metal film 18 forms a portion of a source leading line 30 and a spare line 42, which are described later, for example. The second metal film 20 forms the gate line 13, the gate electrode of the TFT, a portion of the source leading line 30, a portion of a touch leading line 36, terminals 29, 31, 35, 37, and 41, and an inter-line pad 43, which are described later, for example. The third metal film 22 forms the source line 14, the source electrode and the drain electrode of the TFT, a portion of the source leading line 30, a portion of the touch leading line 36, and the inter-line pad 43, for example. The fourth metal film 24 forms a portion of the touch line 17 and a portion of the touch leading line 36, for example. The first, second, third, and fourth interlayer insulating films 19, 21, 23, and 25 and the fifth interlayer insulating film are each formed of an inorganic material, such as silicon nitride ($SiN_x$) and silicon oxide ($SiO_2$), to insulate the upper metal films 20, 22, and 24 and transparent electrode film 26 from the lower metal films 18, 20, 22, and 24, and first transparent electrode film. The semiconducting film is a thin film formed of an oxide semiconductor or amorphous silicon, for example, and forms a channel portion (semiconducting portion) connected to the source electrode and the drain electrode in the TFT. The first transparent electrode film and the second transparent electrode films 26 are each formed of a transparent electrode material (such as indium tin oxide (ITO)). The first transparent electrode film forms the pixel electrodes, for example, and the second transparent electrode film 26 forms the common electrode 15 (touch electrode 16), for example. In FIG. 3 and FIG. 4, the first metal film 18 is indicated by a bold solid line, the second metal film 20 is indicated by a fine solid line, the third metal film 22 is indicated by a fine broken line, and the fourth metal film 24 is indicated by a bold broken line such that the metal films 18, 20, 22, and 24 are distinguishable.

Next, a wiring configuration for supplying various signals to the gate lines 13, the source lines 14, and the touch lines 17 is described in detail. As illustrated in FIG. 3, the gate lines 13 formed of the second metal film 20 are electrically connected to gate circuits 27 and the gate leading line 28 in the non-display area NAA of the array substrate 10b. Two gate circuits 27 are disposed adjacent to the long-side edges of the display area AA and extend in the long-side direction (Y axis direction) of the display area AA. The gate circuits 27 are connected to all the gate lines 13. The gate circuit 27 includes multiple unit circuits lined up in a column. A unit circuit is able to supply power to another unit circuit. Thus, the gate circuit 27 functions as a shift register. The unit circuit is a monolithic circuit on the array substrate 10b and includes the same semiconducting film as the TFTs in the display area AA as the base. The gate leading line 28, which extends in the X axis direction, is connected to the unit circuit of the gate circuit 27 at a first end and is connected to the gate line 13 at a second end. The gate leading line 28 extends from the gate circuit 27 in the X axis direction and a portion thereof connected to the end of the gate line 13 is formed of the third metal film 22. Driving signals (clock signal, low potential signal, and scanning start signal, for example) are supplied to the unit circuits through driving signal main lines 28A and driving signal branched lines 28B. A portion of the driving signal main line 28A that extends in the Y axis direction is formed of the second metal film 20. Thus, the second interlayer insulating film 21 has contact holes CH at positions overlapping a point of connection between the gate leading line 28 formed of the third metal film 22 and the end portion of the gate line 13 formed of the second metal film 20, a point of connection between the driving signal main line 28A formed of the second metal film 20 and the driving signal branched line 28B formed of the third metal film 22. In FIG. 2 to FIG. 4, the contact holes CH are indicated by black dots. Gate terminals 29 connected to the driving signal main lines 28A are formed of the second metal film 20 and are disposed on an end portion of the protruding portion of the array substrate 10b, which is the mounting area of the flexible board 12. The signal output from the flexible board 12 to the gate terminal 29 is sent to the gate circuit 27 through the driving signal main line 28A and the driving signal branched line 28B. The signal is processed into a scanning signal by the gate circuit 27 and is sent to the gate line 13 through the gate leading line 28.

As illustrated in FIG. 3, source leading lines (leading lines) 30 in the non-display area NAA of the array substrate 10b are electrically connected to the source lines 14 formed of the third metal film 22. The source leading lines 30 are spaced apart from each other in the X axis direction as the source lines 14 do. The source leading lines 30 each have a first end portion connected to the end of the source line 14 and a second end portion extending in a fan-like shape toward the mounting area of the driver 11 and having at least a source terminal (terminal) 31 at the extended end. The first end portion (first end portion, end portion adjacent to the source line 14) 30a of the source leading line 30 is formed of the same third metal film 22 as the source line 14. The second end portion (second end portion, end portion adjacent to the source terminal 31) 30b of the source leading line 30 is formed of the second metal film 20 and the third metal film 22. Specifically described, the second end portion 30b of the source leading line 30 includes the source terminal 31 and a source extended portion (extended portion) 32 extending from the source terminal 31 in the Y axis direction (extending direction of the source line 14) toward a side away from the source line 14. The source extended portion 32 is formed of the third metal film 22 and the portion of the second end portion 30b except the source extended portion 32 (including the source terminal 31) is formed of the second metal film 20. The source terminal 31 and the source extended portion 32 are disposed in an area (mounting area) overlapping the driver 11. In this way, the first and second end portions 30a and 30b of the source leading line 30 each include the third metal film 22. An image signal from the driver 11 to the source terminal 31 is sent to the source line 14 through the source leading line 30.

As illustrated in FIG. 4, the source leading lines 30 each have a middle portion 30c extending from the first end portion 30a to the second end portion 30b. The middle portion 30c is formed of any one of the first, second, and third metal films 18, 20, and 22. Specifically described, the middle portions 30c of the source leading lines 30 located next to each other in the X axis direction (arrangement direction of the source leading lines 30) are formed of different metal films 18, 20, and 22. The distance between the middle portions 30c of the source leading lines 30 located next to each other is small in some cases. In such cases, the above configuration prevents short circuit between the source leading lines 30 and is advantageous for higher definition and a smaller frame width. For the above-described configuration, the interlayer first insulating film 19 and the second interlayer insulating film 21 have contact holes CH at positions overlapping a point of connection between the first end portion 30a of the source leading line 30, which is formed of the third metal film 22, and the middle portion 30c formed of any one of the metal films 18, 20, and 22 (except when the first end portion 30a and the middle portion 30c are formed of the same metal film), a point of connection between the middle portion 30c formed of any one of the metal films 18, 20, and 22 and the second end portion 30b formed of the second metal film 20 (except when the first end portion 30a and the middle portion 30c are formed of the same metal film), and a point of connection between the source terminal 31 formed of the second metal film 20 and the source extended portion 32 formed of the third metal film 22 in the second end portion 30b. Here, the second end portion 30b of the source leading line 30 except the source extended portion 32 is formed of the second metal film 20. This allows the middle portion 30c to be formed of any one of the first, second, and third metal films 18, 20, and 22 to achieve easy connection to the source terminal 31 formed of the second metal film 20.

As illustrated in FIG. 3, a source inspection circuit 33 for inspecting the source lines 14, for example, is connected to the source leading lines 30. The source inspection circuit 33 is disposed near one of the short sides of the display area AA that is adjacent to the driver 11 and extend in the short-side direction of the display area AA (X axis direction). The source inspection circuit 33 is connected to all the source leading lines 30. The source inspection circuit 33 includes the same semiconducting film as the TFTs as a base and is a monolithic circuit on the array substrate 10b. Points of connection between the first end portions 30a and the middle portions 30c of the source leading lines 30 overlap the source inspection circuit 33. Multiple source inspection leading lines 34 extend from each of the ends in the long-side direction of the source inspection circuit 33 to the mounting area of the flexible board 12 and each have a source inspection terminal 35 at the extended end. The source inspection leading lines 34 and the source inspection terminals 35 are both formed of the same second metal film 20.

As illustrated in FIG. 2, the touch lines 17 formed of the fourth metal film 24 are connected to the touch electrodes 16 formed of the second transparent electrode film 26 in the display area AA through contact holes (not illustrated) extending through the fourth interlayer insulating film 25 and the fifth interlayer insulating film, which are located therebetween. As illustrated in FIG. 3, touch leading lines (position detection leading lines) 36 in the non-display area NAA of the array substrate 10b are electrically connected to the touch lines 17. The touch leading lines 36 are spaced apart from each other in the X axis direction as the touch lines 17 do. The touch leading lines 36 each have a first end portion connected to the end of the touch line 17 and a second end portion extending in a fan-like shape toward the mounting area of the driver 11 and having at least a touch terminal (terminal) 37 at the extended end. The first end portion (first end portion, end portion adjacent to the touch line 17) 36a of the touch leading line 36 connected to the touchline 17 is formed of the same fourth metal film 24 as the touch line 17. The second end portion (second end portion, end portion adjacent to the touch terminal 37) 36b of the touch leading line 36 having the terminal 37 is formed of the second metal film 20 and the third metal film 22. Specifically described, the second end portion 36b of the touch leading line 36 includes the touch terminal 37 and the touch extended portion 38 extending from the touch terminal 37 in the Y axis direction (extending direction of the touch line 17) toward a side away from the touch line 17. The touch extended portion 38 is formed of the third metal film 22 and the portion of the second end portion 36b except the touch extended portion 38 (including the touch terminal 37) is formed of the second metal film 20. In an area (mounting area) overlapping the driver 11, the source terminals 31 and the source extended portions 32 are located between two groups of the touch terminals 37 and the touch extended portions 38 in the X axis direction. In this way, the first and second end portions 36a and 36b of the touch leading line 36 each include at least one of the third metal film 22 and the fourth metal film 24. A touch signal from the driver 11 to the touch terminal 37 is sent to the touch line 17 through the touch leading line 36.

As illustrated in FIG. 4, the touch leading lines 36 each have a middle portion 36c extending form the first end portion 36a to the second end portion 36b. The middle portion 36c is formed of any one of the second and third metal films 20 and 22. Specifically described, the middle portions 36c of the touch leading lines 36 located next to each other in the X axis direction (arrangement direction of the touch leading lines 36) are formed of different metal films 20 and 22. For the above-described configuration, the second interlayer insulating film 21 has contact holes CH at positions overlapping a point of connection between the first end portion 36a of the touch leading line 36, which is formed of the fourth metal film 24, and the middle portion 36c formed of one of the metal films 20 and 22, a point of connection between the middle portion 36c formed of one of the metal films 20 and 22 and the second end portion 36b formed of the second metal film 20 (except when the middle portion 36c and the second end portion 36b are formed of the same metal film), and a point of connection between the touch terminal 37 formed of the second metal film 20 and the touch extended portion 38 formed of the third metal film 22 in the second end portion 36b.

As illustrated in FIG. 3, touch inspection circuits 39 for inspecting the touch lines 17, for example, are connected to the touch leading lines 36. Two touch inspection detection circuits 39 are disposed such that the source inspection circuit 33 is located between the touch inspection detection circuits 39 and the display area AA. The touch inspection circuits 39 are located adjacent to the ends of the source inspection circuit 33 in the extending direction. The touch inspection circuits 39 extend along the source inspection circuit 33 and are connected to all the touch leading lines 36. The touch inspection circuits 39 include the same semiconducting film as the TFTs as a base and are monolithic circuits on the array substrate 10b as the source inspection circuit 33. Points of connection between the first end portions 36a and the middle portions 36c of the touch leading lines 36 overlap the touch inspection circuits 39. Multiple touch inspection leading lines 40 extend from each of the ends in the long-side direction of the touch inspection circuit 39 to the mounting area of the flexible board 12 and each have a touch inspection terminal 41 at the extended end. The touch inspection leading lines 40 and the touch inspection terminal 41 are both formed of the same second metal film 20.

As illustrated in FIG. 3, in the non-display area NAA, the array substrate 10b of the embodiment has a spare line (backup wire, repairing line) 42 for repairing a defect such as disconnection in the source leading line 30 or the touch leading line 36. The spare line 42 includes at least two line overlapping portions 42a and 42b overlapping the end portions 30a and 30b of the source leading lines 30 and the end portions 36a and 36b of the touch leading lines 36. The line overlapping portions 42a and 42b extend in a substantially straight line in the X axis direction (direction perpendicular to (intersecting) the extending direction of the source lines 14 and the touch lines 17) and intersecting (overlapping) the source leading lines 30 and the touch leading lines 36. One of the line overlapping portions 42a and 42b that overlaps the first end portions 30a and 36a of the source leading lines 30 and the touch leading lines 36 is the first line overlapping portion (display area side overlapping portion, signal line side overlapping portion) 42a and the other that overlaps the second end portions 30b and 36b of the source leading lines 30 and the touch leading lines 36 is the second line overlapping portion (terminal side line overlapping portion, signal line opposite side overlapping portion) 42b. The spare line 42 includes an overlap-to-overlap connecting portion 42c electrically connecting the first line overlapping portion 42a with the second line overlapping portion 42b. The line overlapping portions 42a and 42b of the spare line 42 are formed of the first metal film 18.

Figure 5:
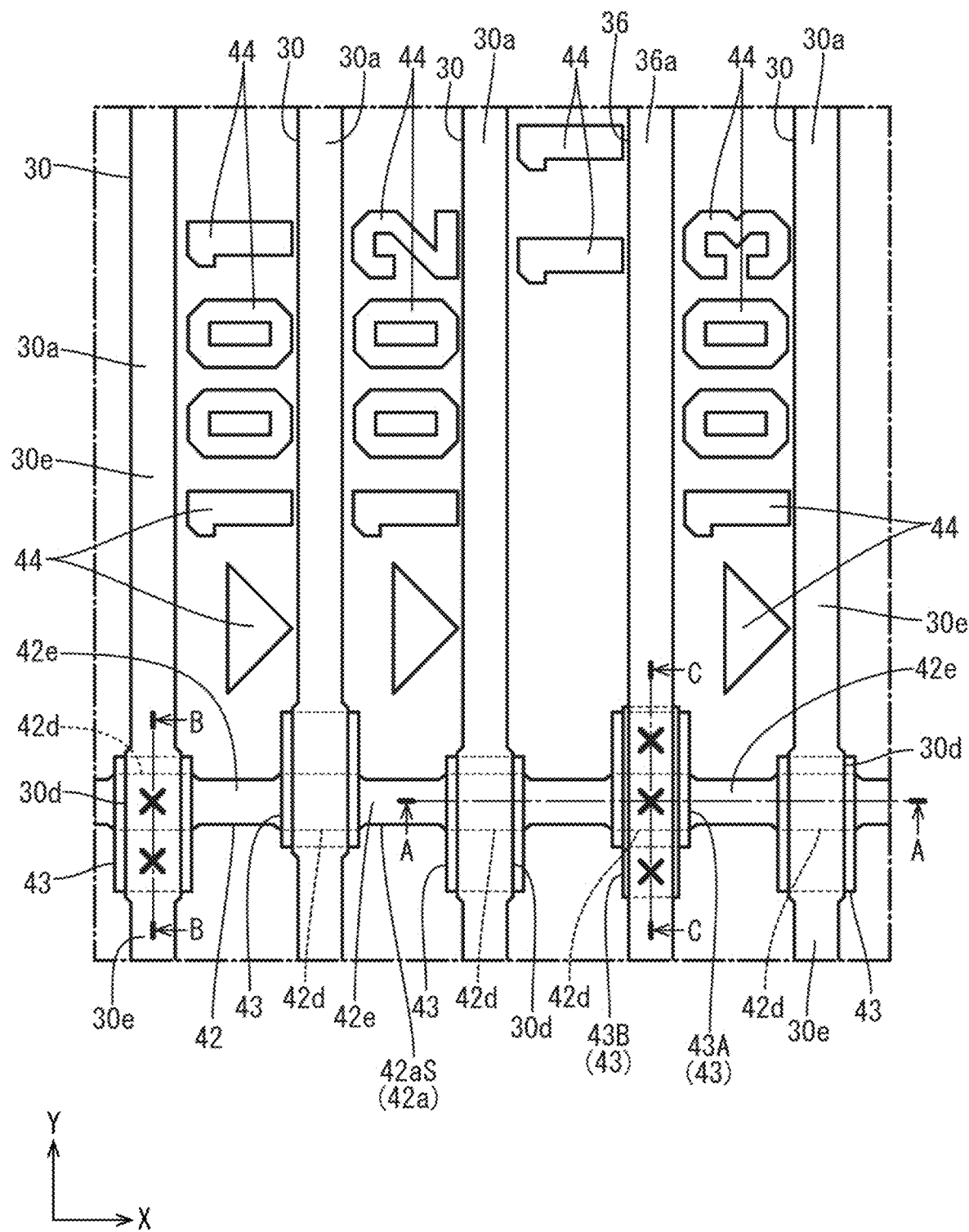
FIG. 5 is a plan view illustrating overlapping portions where source leading lines and touch leading lines overlap a spare line.
Figure 7:
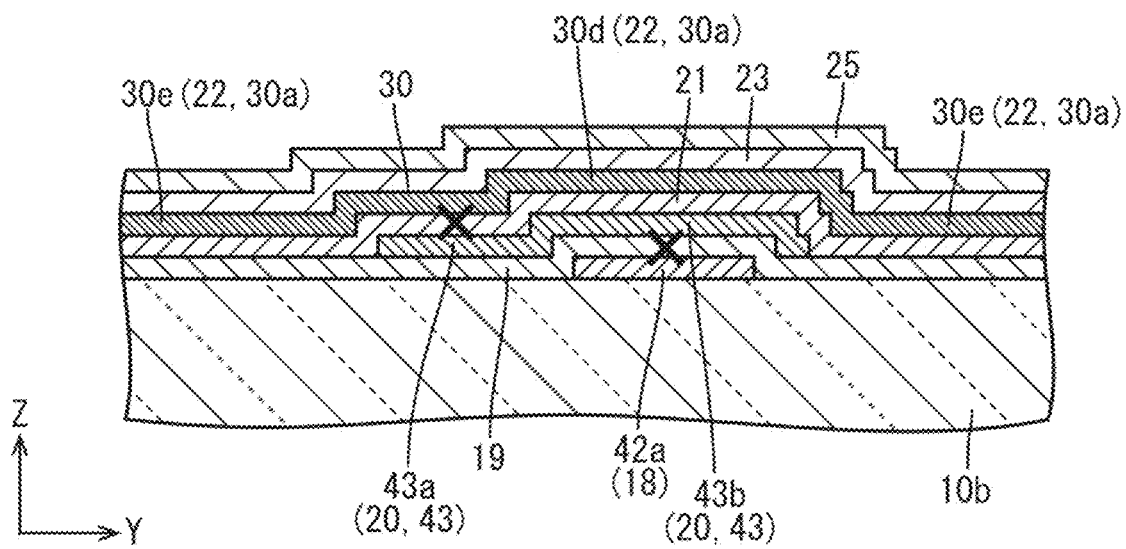
FIG. 7 is a cross-sectional view taken along line B-B in FIG. 5.
Figure 8:
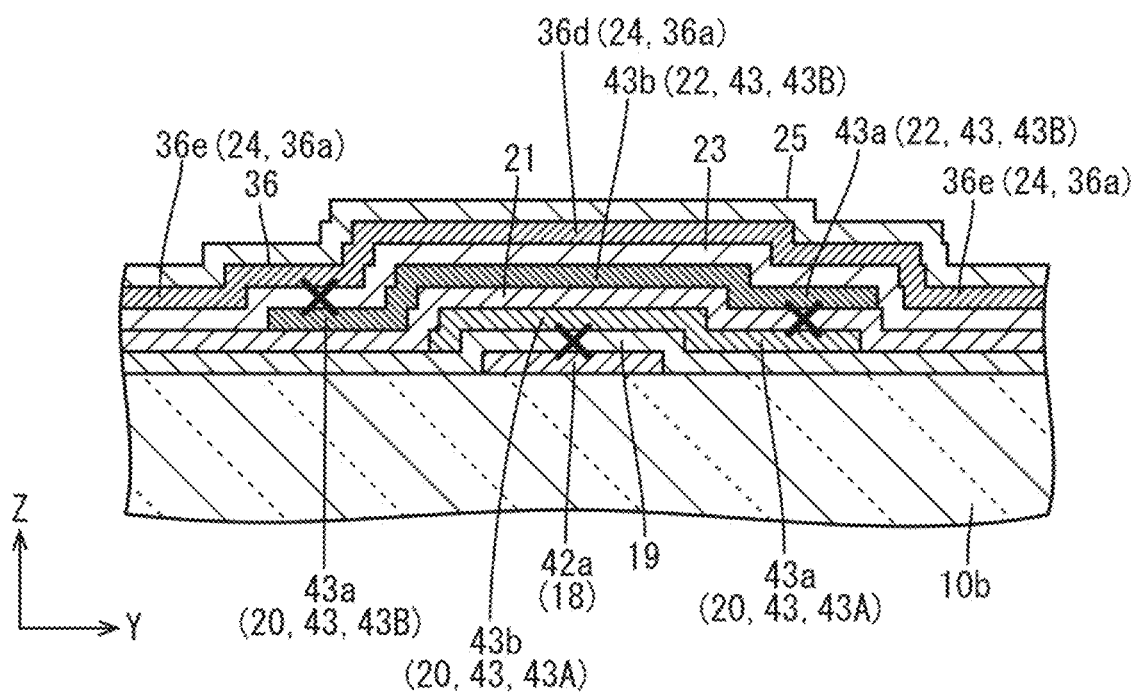
FIG. 8 is a cross-sectional view taken along line C-C in FIG. 5.

As illustrated in FIGS. 5, 7, and 8, if any one of the source leading lines 30 and the touch leading lines 36 has a defect such as disconnection, a laser beam is applied to overlapping portions where the end portions 30a and 30b of the defective source leading line 30 or the end portions 36a and 36b of the defective touch leading line 36 overlap the first and second line overlapping portions 42a and 42b of the spare line 42. The laser beam breaks the interlayer insulating films 19, 21, and 23 at the overlapping portions to cause short circuit at the overlapping portions. In FIGS. 5, 7, and 8, the laser application positions (positions of short-circuit) are indicated by the symbol "x". In FIG. 5, for purpose of illustration, the source leading line 30 and the touch leading line 36 are both irradiated with a laser beam. However, only one of the leading lines 30 and 36 is repaired in an actual case. The line overlapping portions 42a and 42b, which are electrically connected to each other through the overlap-to-overlap connecting portion 42c, allow an image signal or a touch signal to be sent to the source line 14 or the touch line 17 through the spare line 42, improving a yield rate of the array substrates 10b. Here, if the first and second line overlapping portions of the spare line are formed of the second metal film 20, distortion may be caused in an image signal or a touch signal to be sent to the spare line due to parasitic capacitance generated between the end portions 30a, 30b, 36a, and 36b of the leading lines 30 and 36 that are not short-circuited to the spare line and the line overlapping portions. This may increase load applied to the repaired source line 14 or touch line 17.

Contrary to the above-described configuration, as illustrated in FIGS. 7 and 8, since the line overlapping portions 42a and 42b of the spare line 42 are formed of the first metal film 18, the first and second interlayer insulating films 19 and 21 are located between the end portions 30a and 30b of the source leading line 30, which are formed of the third metal film 22, and the line overlapping portions 42a and 42b, and at least the first and second interlayer insulating films 19 and 21 are interposed between the end portions 36a and 36b of the touch leading line 36, which are formed of at least one of the third metal film 22 and the fourth metal film 24, and the line overlapping portions 42a and 42b. This reduces parasitic capacitance between the end portions 30a, 30b, 36a, and 36b of the leading lines 30 and 36 that are not short-circuited to the spare line 42 and the line overlapping portions 42a and 42b of the spare line 42. Thus, distortion is less likely to be caused in an image signal or a touch signal sent to the spare line 42, reducing load to the repaired source line 14 or the repaired touch line 17. Furthermore, since the line overlapping portions 42a and 42b of the spare line 42, which are formed of the first metal film 18, are continuous with the overlap-to-overlap connecting portion 42c formed of the same first metal film 18, the leading lines 30 and 36 are connected to the spare line 42 by short-circuiting the end portions 30a, 30b, 36a, and 36b to the line overlapping portions 42a and 42b by laser irradiation, for example. This configuration has high work efficiency compared with a configuration in which the overlap-to-overlap connecting portion is formed of the second metal film 20 or the third metal film 22.

Specifically described, as illustrated in FIG. 4 and FIG. 6, the first line overlapping portion 42a of the spare line 42, which is formed of the first metal film 18, overlaps the first end portions 30a of the source leading lines 30, which are formed of the third metal film 22, with the first and second interlayer insulating films 19 and 21 therebetween. The first line overlapping portion 42a, which is formed of the first metal film 18, overlaps the first end portions 36a of the touch leading lines 36, which are formed of the fourth metal film 24, with the first, second, and third interlayer insulating films 19, 21, and 23, therebetween. The second line overlapping portion 42b of the spare line 42, which is formed of the first metal film 18, overlaps the source extended portions 32 of the second end portions 30b of the source leading lines 30, which are formed of the third metal film 22, with the first and second interlayer insulating films 19 and 21 therebetween. The second line overlapping portion 42b formed of the first metal film 18 overlaps the touch extended portions 38 of the second end portions 36b of the touch leading lines 36, which are formed of the third metal film 22, with the first and second interlayer insulating films 19 and 21 therebetween. As illustrated in FIG. 5, overlapping portions 42d of the line overlapping portions 42a and 42b of the spare line 42, which overlap the leading lines 30 and 36, have a larger width than non-overlapping portions 42e, which do not overlap the leading lines 30 and 36. Overlapping portions 30d of the end portions 30a and 30b of the source leading lines 30, which overlap the spare line 42, also have a larger width than non-overlapping portions 30e, which do not overlap the spare line 42. This allows more efficient laser application to the line overlapping portions 42a and 42b for electrical connection. Furthermore, if reliable connection is not established on the first attempt, this configuration allows a laser beam to be applied again to a position different from the first position, improving a repairing success rate. Furthermore, the application of laser beam to the multiple positions reduces the resistance at the connecting portion. This more advantageously reduces load to the source line 14 and the touch line 17 repaired by using the spare line 42.

As illustrated in FIG. 3, the first and second line overlapping portions 42a and 42b of the spare line 42, respectively, include four (multiple) divided line overlapping portions 42aS and four divided line overlapping portions 42bS, which cover different sets of the leading lines 30 and 36 as short-circuit targets. Specifically described, the first line overlapping portion 42a of the spare line 42 includes four (multiple) first divided line overlapping portions 42aS overlapping the first end portions 30a and 36a of the leading lines 30 and 36 and the second line overlapping portion 42b includes four second divided line overlapping portions 42bS overlapping the second end portions 30b and 36b of the leading lines 30 and 36. As illustrated in FIG. 3, the four divided line overlapping portions 42aS are symmetrically arranged and the four divided line overlapping portions 42bS are symmetrically arranged. The divided line overlapping portions 42aS and 42bS in symmetric positions overlap the same number of leading lines 30 and 36. The first and second divided line overlapping portions 42aS and 42bS overlapping the same leading lines 30 and 36 (covering the same leading lines 30 and 36 as short-circuit targets) are electrically connected to each other by the overlap-to-overlap connecting portions 42c. Two of the overlap-to-overlap connecting portions 42c are disposed at the middle position of the array substrate 10b in the arrangement direction of the leading lines 30 and 36 (X axis direction). Two of the overlap-to-overlap connecting portions 42c are disposed such that the source inspection circuit 33 is located between the overlap-to-overlap connecting portions 42c in the arrangement direction. The former two overlap-to-overlap connecting portions 42c are connected to the ends of two of the divided line overlapping portions 42aS that are located at the middle in the arrangement direction and the ends of two of the divided line overlapping portions 42bS that are located at the middle in the arrangement direction. The latter two overlap-to-overlap connecting portions 42c are connected to the ends of two of the divided line overlapping portions 42aS that are located at the ends in the arrangement direction and the ends of two of the divided line overlapping portions 42bS that are located at the ends in the arrangement direction. This configuration enables the spare line 42 to repair up to four leading lines 30 and 36. This configuration reduces the number of leading lines 30 and 36 not to be short-circuited to the divided line overlapping portions 42aS and 42bS to about a quarter, reducing parasitic capacitance generated between the leading lines 30 and 36 not to be short-circuited and the divided line overlapping portions 42aS and 42bS. This reduces load to the repaired source line 14 and touch line 17.

As illustrated in FIG. 5 and FIG. 6, in the non-display area NAA of the array substrate 10b, an inter-line pad 43 at least formed of the second metal film 20 is disposed. The inter-line pad 43 overlaps the end portions 30a, 30b, 36a, and 36b of the leading lines 30 and 36 and the first and second line overlapping portions 42a and 42b of the spare line 42. As described above, since the end portions 30a, 30b, 36a, and 36b of the leading lines 30 and 36 are formed at least one of the third metal film 22 and the fourth metal film 24 and the first and second line overlapping portions 42a and 42b of the spare line 42 are formed of the first metal film 18, the inter-line pad 43 at least formed of the second metal film 20 overlaps the end portions 30a, 30b, 36a, and 36b and the first and second line overlapping portions 42a and 42b with any one of the interlayer insulating films 19, 21, 23, and 25 therebetween. In this configuration, if any one of leading lines 30 and 36 has a defect such as disconnection, the end portion 30a, 30b, 36a, or 36b of the defective leading line 30 or 36 is short-circuited to the overlapping inter-line pad 43 and the first and second line overlapping portions 42a and 42b of the spare line 42 are short-circuited to the overlapping inter-line pad 43. In this configuration, the end portions 30a, 30b, 36a, and 36b of the leading lines 30 and 36, which are formed of at least one of the third metal film 22 and the fourth metal film 24, are able to be electrically connected to the first and second line overlapping portions 42a and 42b of the spare line 42, which are formed of the first metal film 18, through the inter-line pad 43, which is formed of at least the second metal film 20. This configuration has higher connection reliability compared with a configuration in which the end portion is directly short-circuited to the line overlapping portion by application of a laser beam to one position without the inter-line pad 43 therebetween. In FIGS. 5 to 8, the first end portions 30a and 36a of the leading lines 30 and 36, the first line overlapping portion 42a of the spare line 42, and the overlapping inter-line pad 43 are representatively illustrated. The planar configurations and the cross-sectional configurations of the second end portions 30b and 36b, the second line overlapping portion 42b, and the overlapping inter-line pad 43 are similar to those of the first end portion 30a of the source leading line 30, the first line overlapping portion 42a, and the overlapping inter-line pad 43.

Specifically described, as illustrated in FIG. 6 and FIG. 7, the inter-line pad 43, which is formed of the second metal film 20, overlaps the first end portion 30a of the source leading line 30, which is formed of the third metal film 22, and the first line overlapping portion 42a of the spare line 42, which is formed of the first metal film 18. The inter-line pad 43 formed of the second metal film 20 also overlaps the source extended portion 32 of the second end portion 30b of the source leading line 30, which is formed of the third metal film 22, and the second line overlapping portion 42b of the spare line 42, which is formed of the first metal film 18 (see FIGS. 4, 6, and 7). The inter-line pad 43 formed of the second metal film 20 overlaps the touch extended portion 38 of the second end portion 36b of the touch leading line 36, which is formed of the third metal film 22, and the second line overlapping portion 42b of the spare line 42, which is formed of the first metal film 18 (see FIGS. 4, 6, and 8). As illustrated in FIG. 7, when the end portion 30a, 30b, or 36b and the line overlapping portion 42a or 42b, which have only the inter-line pad 43 formed of the second metal film 20 therebetween, are short-circuited to each other, a laser beam is applied to an overlapping portion where the inter-line pad 43 overlaps the end portion 30a, 30b, or 36b and an overlapping portion where the inter-line pad 43 overlaps the line overlapping portion 42a or 42b to break the first and second interlayer insulating films 19 and 21 between them.

By contrast, as illustrated in FIG. 6 and FIG. 8, two inter-line pads 43 overlap the first end portion 36a of the touch leading line 36, which is formed of the fourth metal film 24, and the first line overlapping portion 42a of the spare line 42, which is formed of the first metal film 18. The two inter-line pads 43 include a first inter-line pad (lower inter-line pad) 43A formed of the second metal film 20 and a second inter-line pad (upper inter-line pad) 43B formed of the third metal film 22. When the first end portion 36a and the first line overlapping portion 42a, which have the first inter-line pad 43A formed of the second metal film 20 and the second inter-line pad 43B formed of the third metal film 22 therebetween, are short-circuited to each other, a laser beam is applied to an overlapping portion where the first inter-line pad 43A overlaps the first line overlapping portion 42a, an overlapping portion where the first inter-line pad 43A overlaps the second inter-line pad 43B, and an overlapping portion where the second inter-line pad 43B overlaps the first end portion 36a, to break the first, second, and third interlayer insulating films 19, 21, and 23 between them.

As illustrated in FIG. 5, the inter-line pad 43 includes leading line overlapping portions 43a overlapping the end portions 30a, 30b, 36a, and 36b of the leading lines 30 and 36 and spare line overlapping portions 43b overlapping the first and second line overlapping portions 42a and 42b of the spare line 42. In this configuration, if any one of the leading lines 30 and 36 has a defect such as disconnection, the end portion 30a, 30b, 36a, or 36b of the defective leading line 30 or 36 is separately short-circuited to the overlapping leading line overlapping portion 43a, and the first and second line overlapping portions 42a and 42b of the spare line 42 are short-circuited to the overlapping spare line overlapping portion 43b. Thus, this configuration has higher short circuit reliability compared with a configuration in which the inter-line pad is selectively disposed only at the overlapping portions (intersections) where the end portions 30a, 30b, 36a, and 36b of the leading lines 30 and 36 overlap the line overlapping portions 42a and 42b of the spare line 42.

Specifically described, as illustrated in FIG. 5, the inter-line pad 43 extends from each of the overlapping portions where the end portions 30a, 30b, 36a, and 36b of the leading lines 30 and 36 overlap the line overlapping portions 42a and 42b of the spare line 42 in the Y axis direction along the leading lines 30 and 36. In other words, the substantially entire inter-line pad 43 overlaps the end portions 30a, 30b, 36a, and 36b of the leading lines 30 and 36. Thus, the spare line overlapping portion 43b, which overlaps the first and second line overlapping portions 42a and 42b of the spare line 42, overlap the end portions 30a, 30b, 36a, and 36b of the leading lines 30 and 36, but the leading line overlapping portion 43a does not overlap the first and second line overlapping portions 42a and 42b of the spare line 42. In this configuration, the arrangement area of the inter-line pad 43 is small compared with a case in which the spare line overlapping portion does not overlap the end portions 30a, 30b, 36a, and 36b of the leading lines 30 and 36. More specifically described, the inter-line pad 43 overlapping the three end portions 30a, 30b, and 36b of the leading lines 30 and 36 extends from the overlapping portions to the upper side or the lower side in FIG. 5 and the extending directions of the portions of the inter-line pad 43 extending from the overlapping portions located next to each other in the X axis direction are opposite to each other. Of the inter-line pads 43 overlapping the first end portion 36a of the touch leading line 36, the first inter-line pad 43A, which is the lower inter-line pad formed of the second metal film 20, extends from the overlapping portions to the upper side or the lower side in FIG. 5, and the second inter-line pad 43B, which is the upper inter-line pad and formed of the third metal film 22, extends from the overlapping portions to the upper side and the lower side in FIG. 5. Thus, the second inter-line pad 43B has a portion overlapping the substantially entire area of the first inter-line pad 43A.

Furthermore, as illustrated in FIG. 5, the non-display area NAA of the array substrate 10b has wiring marks 44, which indicate wiring number, for example, at positions near the overlapping portions where the end portions 30a, 30b, 36a, and 36b of the leading lines 30 and 36 overlap the line overlapping portions 42a and 42b of the spare line 42. The wiring mark 44 allows an operator to visually confirm the wiring number and the position of the leading line 30 or 36 to be repaired before the repairing operation. The wiring marks 44 are formed of the first metal film 18. In this configuration, even if the wiring mark overlaps a light-blocking portion such as another line (including a light-blocking portion of the CF substrate 10a), the wiring mark 44 is easy to see through the glass substrate of the array substrate 10b during the repairing operation. The wiring marks 44 in FIG. 5 are merely examples and the wiring numbers or the number of digits of the wiring number may be suitably changed.

As illustrated in FIG. 2, the leading lines 30 and 36 each at least partly overlap the sealing portion 10d. Light (ultraviolet rays, for example) for curing the photocurable resin material of the sealing portion 10d may be applied from the side of the array substrate 10b. In such a case, the leading lines 30 and 36, which at least partly overlap the sealing portion 10d, are each desired to have a smaller width to allow more curing light to pass. Although such a configuration is more likely to allow a defect such as disconnection to occur, the defective one of the leading lines 30 and 36 is able to be repaired by being short-circuited to the spare line 42.

As described above, the array substrate (wiring substrate) 10b of the embodiment includes the first metal film (first conductive film) 18, the second metal film (second conductive film) 20 disposed over the first metal film 18 with the first interlayer insulating film (first insulating film) 19 therebetween, the third metal film (third conductive film) 22 disposed over the second metal film 20, at a side away from the first metal film 18, with the second interlayer insulating film (second insulating film) 21 therebetween, the source lines (signal lines) 14 formed of the third metal film 22, the source leading lines (leading lines) 30 each having the first end portion (first end portion) 30a connected to the source line 14 and the second end portion (second end portion) 30b through which a signal to the source line 14 enters, at least the end portions 30a and 30b of the source leading lines 30 being formed of the third metal film 22, and the spare line 42 including at least the first and second line overlapping portions 42a and 42b, respectively, overlapping the first and second end portions 30a and 30b of the source leading lines 30, the line overlapping portions 42a and 42b being formed of the first metal film 18 and allow electrically connection to each other.

In this configuration, the signal inputted to the source leading line 30 through the second end portion 30b is sent through the source leading line 30 to the source line 14 connected to the first end portion 30a of the source leading line 30. If any one of the source leading lines 30 has a defect such as disconnection, the end portions 30a and 30b of the defective source leading line 30 are short-circuited to the first and second line overlapping portions 42a and 42b of the spare line 42 overlapping the end portions 30a and 30b by laser irradiation, for example, and the first and second line overlapping portions 42a and 42b are electrically connected to each other to allow the signal to be sent to the source line 14 through the spare line 42.

Here, if the line overlapping portions of the spare line are formed of the second metal film 20, distortion may be caused in a signal sent to the spare line due to parasitic capacitance between the end portions 30a and 30b of the source leading line 30 not to be short-circuited to the spare line and the line overlapping portions, leading to an increase in load to the source line 14. However, since the spare line 42 has the line overlapping portions 42a and 42b formed of the first metal film 18, the first and second interlayer insulating films 19 and 21 are located between the end portions 30a and 30b of the source leading line 30, which are formed of the third metal film 22, and the line overlapping portions 42a and 42b. This reduces parasitic capacitance between the end portions 30a and 30b of the source leading line 30 not to be short-circuited to the spare line 42 and the line overlapping portions 42a and 42b of the spare line 42, and thus distortion is less likely to be caused in a signal sent to the spare line 42. This reduces load to the source line 14.

Furthermore, the array substrate 10b includes the inter-line pad 43 overlapping the first and second end portions 30a and 30b of the source leading line 30 and the first and second line overlapping portions 42a and 42b of the spare line 42. The inter-line pad 43 is formed of the second metal film 20. In this configuration, if the source leading line 30 has a defect such as disconnection, the end portions 30a and 30b of the source leading line 30 and the line overlapping portions 42a and 42b of the spare line 42 are short-circuited to the overlapping inter-line pad 43. In this way, the source leading line 30 having a portion formed of the third metal film 22 and the spare line 42 formed of the first metal film 18 are electrically connected to each other via the inter-line pad 43 formed of the second metal film 20. This configuration has higher connection reliability than a configuration in which the end portions are directly short-circuited to the line overlapping portions 42a and 42b.

Furthermore, the inter-line pad 43 has the leading line overlapping portions 43a overlapping the first and second end portions 30a and 30b of the source leading lines 30, and the spare line overlapping portions 43b overlapping the first and second line overlapping portions 42a and 42b of the spare line 42. With this configuration, if the source leading line 30 has a defect such as disconnection, the end portions 30a and 30b of the source leading line 30 are short-circuited to the overlapping leading line overlapping portions 43a and the line overlapping portions 42a and 42b of the spare line 42 are short-circuited to the overlapping spare line overlapping portions 43b. Thus, this configuration has higher short circuit reliability than a configuration in which the inter-line pad is disposed over an overlapping portion where the end portions 30a and 30b of the source leading lines 30 and the line overlapping portions 42a and 42b of the spare line 42 overlap each other.

Furthermore, the spare line overlapping portion 43b of the inter-line pad 43 overlaps the end portions 30a and 30b of the source leading lines 30 and the leading line overlapping portions 43a do not overlap the line overlapping portions 42a and 42b of the spare line 42. This configuration requires a smaller arrangement space for the inter-line pad 43 than a configuration in which the spare line overlapping portions 43b do not overlap the end portions 30a and 30b of the source leading line 30.

Furthermore, the array substrate 10b includes the fourth metal film (fourth conductive film) 24 disposed over the third metal film 22, at a side away from the second metal film 20, with the third interlayer insulating film (third insulating film) 23 therebetween, the second transparent electrode film (transparent electrode film) 26 disposed over the fourth metal film 24, at a side away from the third metal film 22, with the fourth interlayer insulating film (fourth insulating film) 25 therebetween, the touch electrode (position detection electrode) 16 configured to form capacitance with a position input body that inputs a position to enable detection of a position inputted by the position input body, the touch electrode 16 being formed of the first transparent electrode film 26, the touch lines (position detection lines) 17 extending along the source lines 14 and connected to the touch electrode 16 through the contact holes at least in the fourth interlayer insulating film 25, the touch lines 17 being formed of the fourth metal film 24, and the touch leading lines (position detection leading lines) 36 each having the first end portion (first end portion) 36a connected to the touch line 17 and the second end portion (second end portion) 36b through which a signal to the touch line 17 enters, the first and second end portions 36a and 36b of the touch leading lines 36 at least being formed of at least one of the third metal film 22 and the fourth metal film 24. The first and second line overlapping portions 42a and 42b of the spare line 42, respectively, overlap the first and second end portions 36a and 36b of the touch leading lines 36. In this configuration, the signal inputted to the touch leading line 36 through the second end portion 36b is sent through the touch leading line 36 to the touch line 17 connected to the first end portion 36a of the touch leading line 36. The touch electrode 16 generates capacitance with the position input body that inputs a position, and thus the position inputted by the position input body is detected by using the signal supplied through the touch line 17. If any one of the touch leading lines 36 has a defect such as disconnection, the end portions 36a and 36b of the defective touch leading line 36 are short-circuited to the overlapping line overlapping portions 42a and 42b of the spare line 42 by laser irradiation, for example, and the line overlapping portions 42a and 42b are electrically connected to each other such that the signal is sent to the touch line 17 through the spare line 42. In this configuration, since the line overlapping portions 42a and 42b of the spare line 42, which are formed of the first metal film 18, overlap the end portions 36a and 36b of the touch leading line 36, which are formed of at least one of the third metal film 22 and the fourth metal film 24, at least the first interlayer insulating film 19 and the second interlayer insulating film 21 are located between the end portions 36a and 36b of the touch leading line 36 and the line overlapping portions 42a and 42b. This reduces parasitic capacitance between the end portions 36a and 36b of the touch leading line 36 not to be short-circuited to the spare line 42 and the line overlapping portions 42a and 42b of the spare line 42. Thus, distortion is less likely to be caused in the signal sent to the spare line 42, reducing load to the touch line 17.

Furthermore, the first and second line overlapping portions 42a and 42b of the spare line 42, respectively, include the divided line overlapping portions 42aS and 42bS, which cover different sets of the source leading lines 30 as short-circuit targets. The divided line overlapping portions 42aS and 42bS that overlap the first end portions 30a of the source leading lines 30 allow electrically connection to the corresponding divided line overlapping portions 42aS and 42bS that overlap the second end portions 30b of the source leading lines 30. In this configuration, the number of source leading lines 30 not to be short-circuited to the divided line overlapping portions 42aS and 42bS is small compared with that in a configuration in which the line overlapping portions are not divided into sections, reducing parasitic capacitance generated between the leading lines 30 not to be short-circuited and the divided line overlapping portions 42aS and 42bS. This reduces load to the source line 14.

Furthermore, the source leading lines 30 each have the middle portion 30c not overlapping the spare line 42 and the middle portion 30c is formed of any one of the first, second, and third metal film 18, 20, and 22. The middle portions 30c of the source leading lines 30 located next to each other are formed of different two of the metal films 18, 20, and 22. The distance between the middle portions 30c of the source leading lines 30 located next to each other is small in some cases. In such cases, the above configuration prevents short circuit between the source leading lines 30, because the adjacent middle portions 30c are formed of different two of the first, second, and third metal films 18, 20, and 22. This is advantageous for higher definition and a smaller frame width.

Furthermore, the second end portions 30b of the source leading lines 30 each include the source terminal (terminal) 31 through which a signal enters, and the source terminal 31 is formed of the second metal film 20. This allows the middle portions 30c of the source leading lines 30 to be formed of any one of the first, second, and third metal films 18, 20, and 22 to achieve easy connection to the source terminal 31 formed of the second metal film 20.

Furthermore, the spare line 42 includes the overlap-to-overlap connecting portion 42c extending from one of the line overlapping portions 42a and 42b to the other and formed of the first metal film 18. In this configuration, since the line overlapping portions 42a and 42b formed of the first metal film 18 are continuous with the overlap-to-overlap connecting portion 42c formed of the same first metal film 18, the source leading line 30 is connected to the spare line 42 by short-circuiting the end portions 30a and 30b to the line overlapping portions 42a and 42b by laser irradiation, for example. This configuration has high work efficiency compared with a configuration in which the overlap-to-overlap connecting portion 42c is formed of the second metal film 20 or the third metal film 22.

Furthermore, the liquid crystal panel (display device) 10 of the embodiment includes the above-described array substrate 10b, the CF substrate (counter substrate) 10a having a plate surface facing a plate surface of the array substrate 10b with the inner space IS therebetween, and the sealing portion 10d disposed between the array substrate 10b and the CF substrate 10a and surrounding the inner space IS. The source leading lines 30 at least partly overlap the sealing portion 10d. In this configuration, the sealing portion 10d between the array substrate 10b and the CF substrate 10a surrounds the inner space IS to seal the inner space IS. When the sealing portion 10d is formed of a photocurable resin material, for example, light for curing the photocurable resin material may be applied from the side of the array substrate 10b. In such a case, the source leading line 30, which at least partly overlap the sealing portion 10d, is desired to have a smaller width to allow more curing light to pass. Although such a configuration is more likely to allows a defect such as disconnection to occur, the defective leading line 30 is able to be repaired by being short-circuited to the spare line 42.

Second Embodiment

A second embodiment of the invention is described with reference to FIG. 9. In the second embodiment, a spare line 142 has a different configuration. The same components, effects, and advantages as those in the first embodiment are not repeatedly described.

Figure 9:
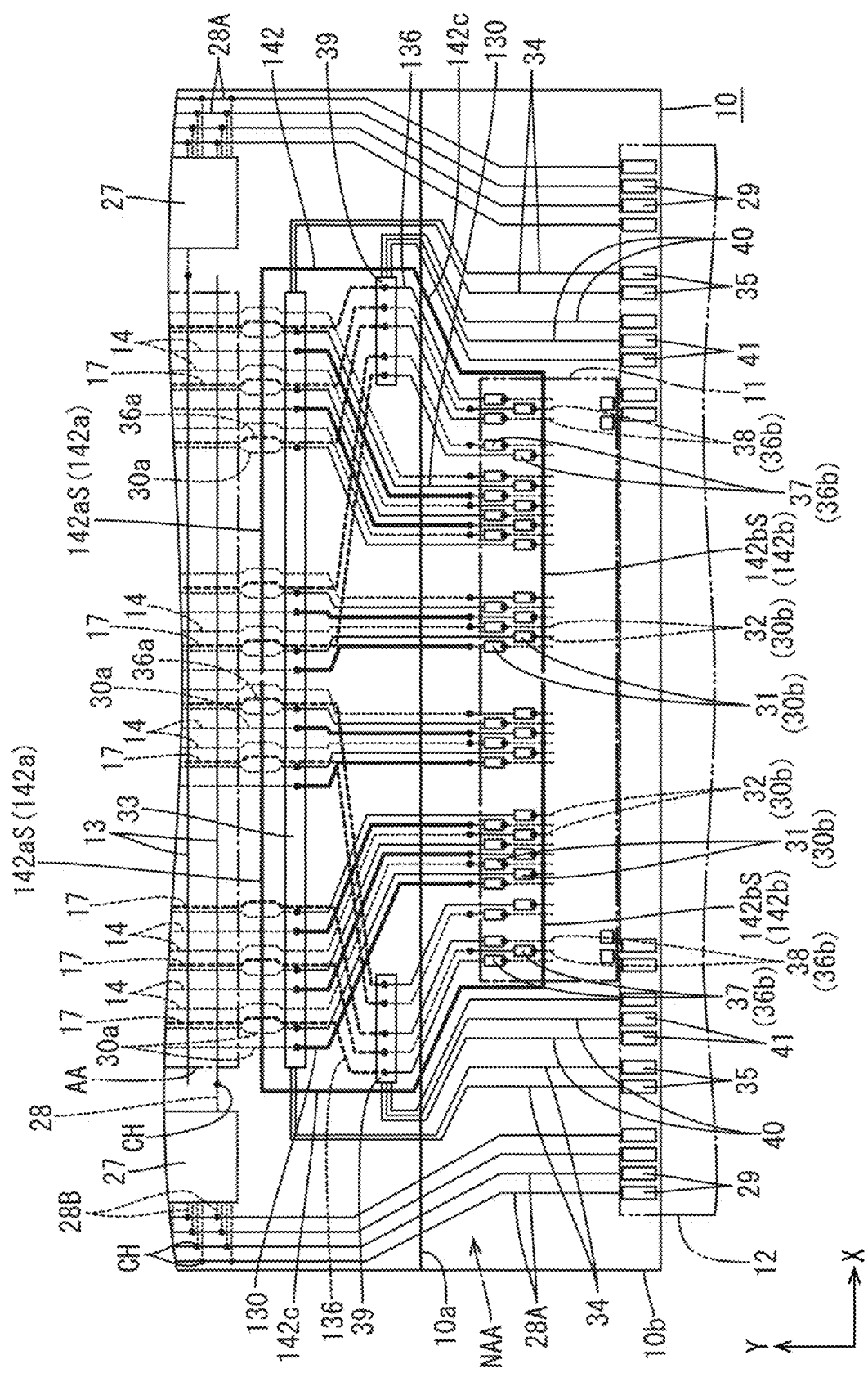
FIG. 9 is a plan view schematically illustrating a wiring configuration in a non-display area of an array substrate according to a second embodiment of the invention.

As illustrated in FIG. 9, the spare line 142 in this embodiment has a line overlapping portion 142a including two divided line overlapping portions 142aS and a line overlapping portion 142b including two divided line overlapping portions 142bS. Each of the line overlapping portions 142a and 142b is divided at substantially the middle in the arrangement direction of leading lines 130 and 136 (X axis direction). The number of leading lines 130 and 136 intersecting (overlapping) one of the two divided line overlapping portions 142aS and 142bS is substantially equal to the number of leading lines 130 and 136 intersecting the other of the two divided line overlapping portions 142aS and 142bS (about a half of the total). The first divided line overlapping portion 142aS and the second divided line overlapping portion 142bS that cover the same leading lines as short-circuit targets are electrically connected to each other by an overlap-to-overlap connecting portion 142c. The overlap-to-overlap connecting portion 142c has ends connected to the ends of the divided line overlapping portions 142aS and 142bS that are located at sides away from the divided position, i.e., connected to the outer ends in the arrangement direction. Here, in the first embodiment, some of the touch leading lines 36 (the touch leading lines 36 corresponding to the two inner divided line overlapping portions 42aS of the four divided line overlapping portions 42aS) are not covered as disconnection repairing targets in some cases. However, the second embodiment covers all the touch leading lines 136 as disconnection repairing targets.

Third Embodiment

A third embodiment of the invention is described with reference to FIG. 10. In the third embodiment, a source inspection circuit 233 is located differently from that in the first embodiment. The same components, effects, and advantageous those described in the first embodiment are not described.

Figure 10:
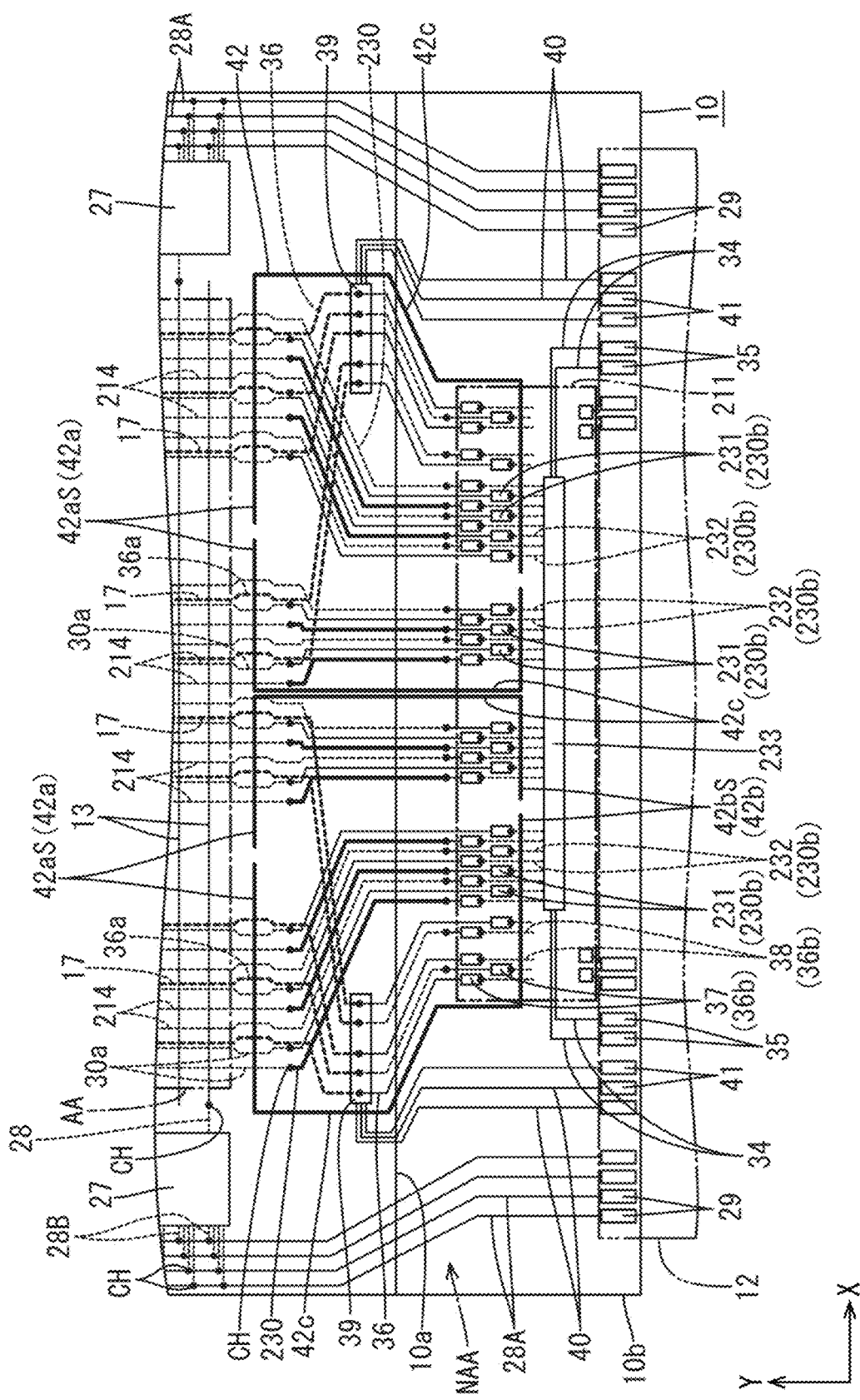
FIG. 10 is a plan view schematically illustrating a wiring configuration in a non-display area of an array substrate according to a third embodiment of the invention.

As illustrated in FIG. 10, the source inspection circuit 233 in this embodiment overlaps a driver 211 in plan view. This configuration, which has the source inspection circuit 233 in the mounting area of the driver 211, allows an area for source leading lines 230 to be larger. This is advantageous for higher definition and a smaller frame width. The source leading line 230 has a second end portion 230b having a source extended portion (inspection circuit connecting portion) 232 and the extended end of the source extended portion 232 extending from the source terminal 231 to a side away from the source line 214 is connected to the source inspection circuit 233. In other words, the source inspection circuit 233 is mounted in the mounting area of the driver 211 such that the source extended portion 232 is located between the source inspection circuit 233 and the source terminal 231 connected to the driver 211. In this configuration, an inspection of the source line 214 for disconnection, for example, is performed by supplying an inspection signal from the source inspection circuit 233 to the second end portion 230b of the source leading line 230. The inspection signal is sent to the source line 214 through the source extended portion 232 and the source terminal 231 included in the second end portion 230b of the source leading line 230, and thus the entire source leading line 230 is inspected in addition to the source line 214.

As described above, this embodiment includes the inspection circuit (source inspection circuit) 233 for inspecting the source lines 214. The second end portions 230b of the source leading lines 230 each include the source terminal 231 through which a signal enters and the source extended portion (inspection circuit connecting portion) 232 extending from the source terminal 231 to the side away from the source line 214 and connected to the source inspection circuit 233. In this configuration, an inspection of the source line 214 is performed by supplying an inspection signal from the source inspection circuit 233 to the second end portion 230b of the source leading line 230. The inspection signal is sent to the source line 214 through the source extended portion 232 and the source terminal 231 included in the second end portion 230b of the source leading line 230. Thus, the entire source leading line 230 is inspected in addition to the source line 214.

Furthermore, this embodiment includes the driver 211 overlapping the source terminals 231 and connected to the source terminals 231. The source inspection circuit 233 overlaps the driver 211. In this configuration, the source inspection circuit 233 is disposed in the mounting area of the driver 211. This is advantageous for higher definition and smaller frame width.

Fourth Embodiment

A fourth embodiment of the invention is described with reference to FIG. 11. In the fourth embodiment, a touch inspection circuit 339 is located differently from that in the fourth embodiment. The same components, effect, and advantages as those in the fourth embodiment are not described.

Figure 11:
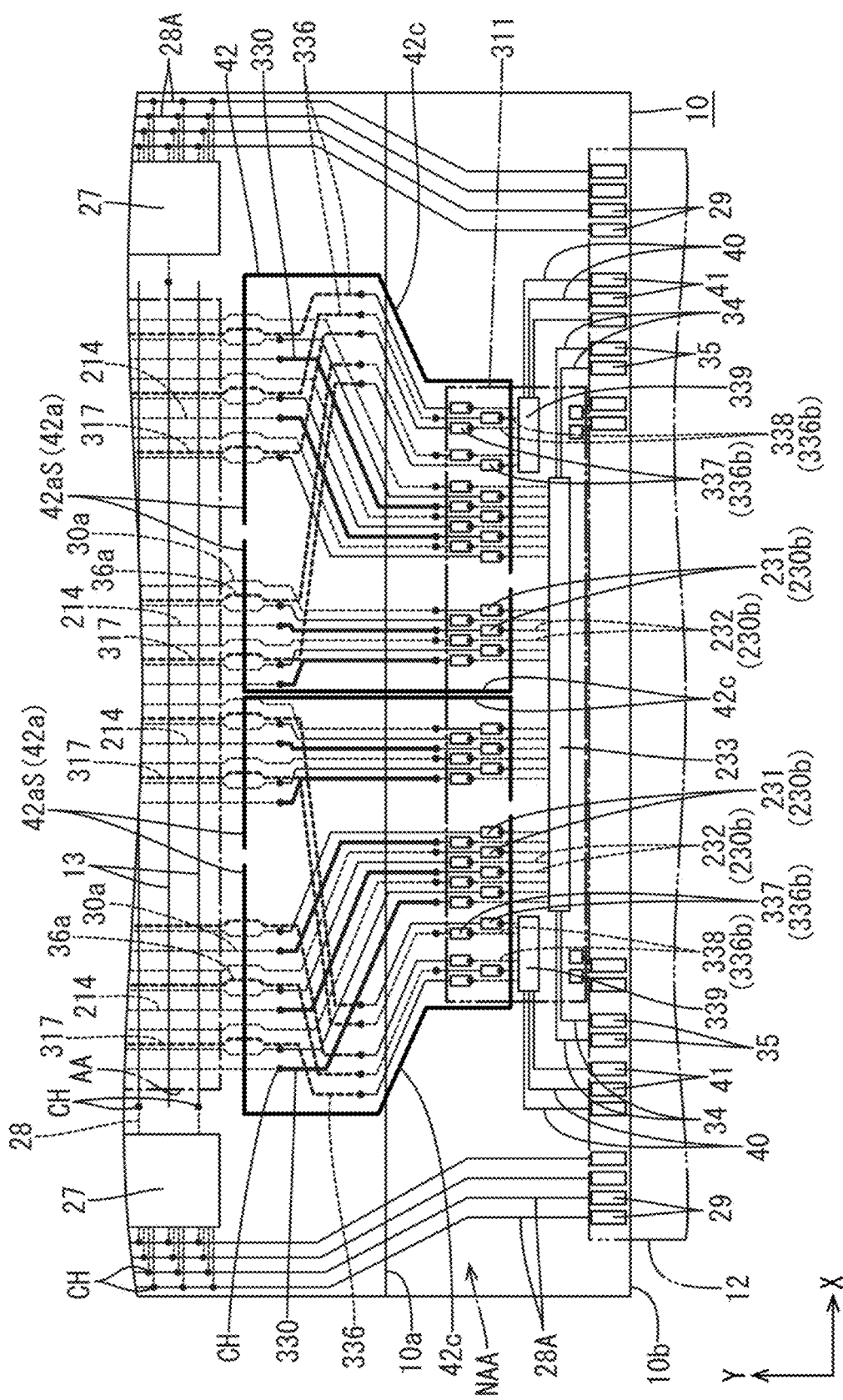
FIG. 11 is a plan view schematically illustrating a wiring configuration in a non-display area of an array substrate according to a fourth embodiment of the invention.

As illustrated in FIG. 11, the touch inspection circuit 339 in this embodiment overlaps a driver 311 in plan view. This configuration, which has the touch inspection circuit 339 in the mounting area of the driver 311, allows an area for the source leading lines 330 and the touch leading lines 336 to be larger. This is advantageous for higher definition and a smaller frame width. The touch leading line 336 has a second end portion 336b having a touch extended portion (inspection circuit connecting portion) 338 and the extended end of the touch extended portion 338 extending from the touch terminal 337 to a side away from the touch line 317 is connected to the touch inspection circuit 339. In other words, the touch inspection circuit 339 is mounted in the mounting area of the driver 311 such that the touch extended portion 338 is located between the touch inspection circuit 339 and the touch terminal 337 connected to the driver 311. In this configuration, an inspection of the touch line 317 for disconnection, for example, is performed by supplying an inspection signal from the touch inspection circuit 339 to the second end portion 336b of the touch leading line 336. The inspection signal is sent to the touch line 317 through the touch extended portion 338 and the touch terminal 337 included in the second end portion 336b of the touch leading line 336, and thus the entire touch leading line 336 is inspected in addition to the touch line 317.

Fifth Embodiment

A fifth embodiment of the invention is described with reference to FIG. 12 or FIG. 13. In the fifth embodiment, a spare line 442 has a configuration different from that in the first embodiment. The same components, effects, and advantages as those described in the first embodiment are not described.

Figure 12:
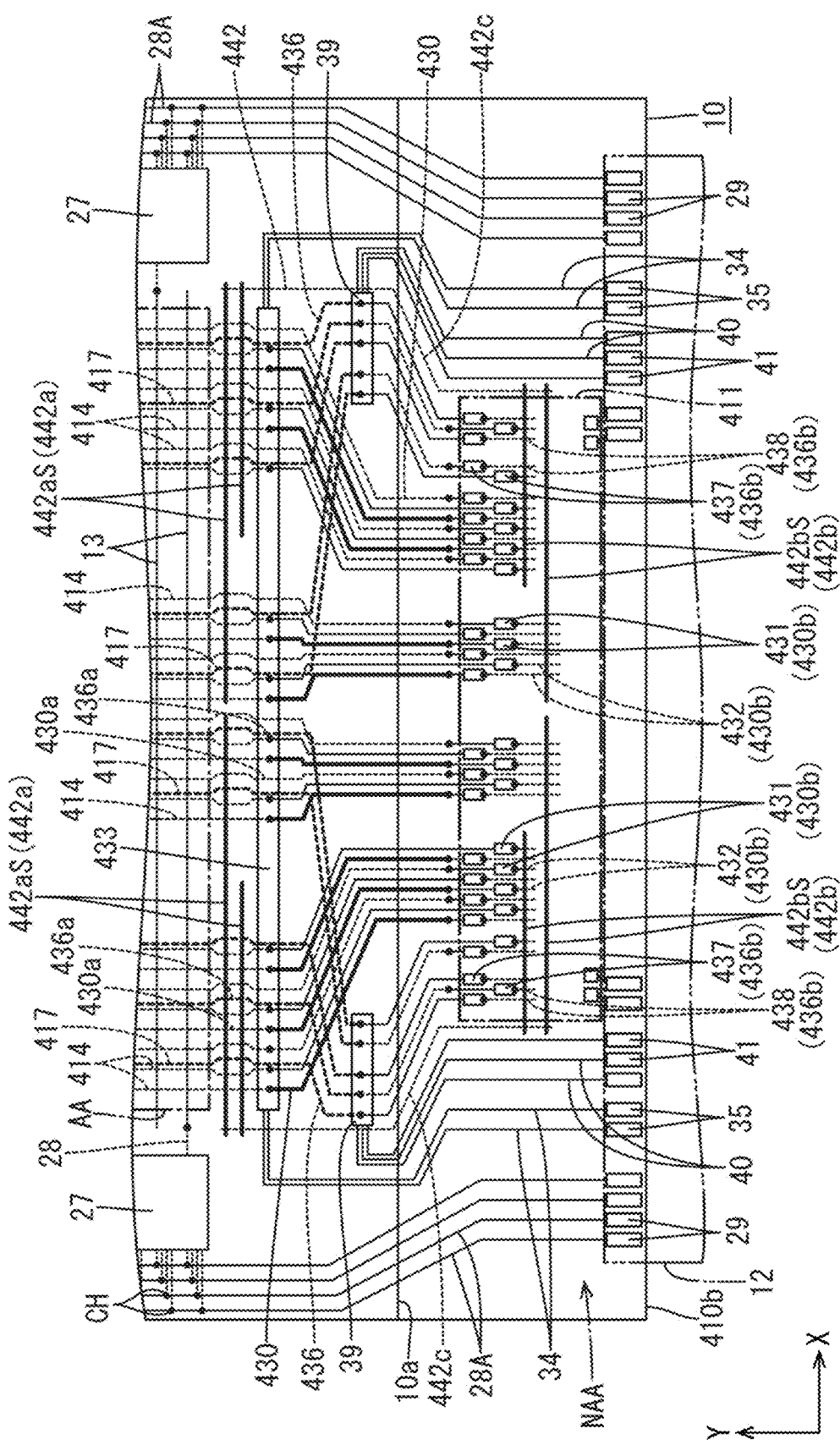
FIG. 12 is a plan view schematically illustrating a wiring configuration in a non-display area of an array substrate according to a fifth embodiment of the invention.

As illustrated in FIG. 12, the spare line 442 in this embodiment have first and second line overlapping portions 442a and 442b formed of the first metal film and overlap-to-overlap connecting portions 442c formed of the third metal film. Specifically described, the first and second line overlapping portions 442a and 442b, respectively, include four divided line overlapping portions 442aS and four divided line overlapping portions 442bS. The divided line overlapping portions 442aS are spaced apart in the Y axis direction and have different lengths, and the divide line overlapping portions 442bS are spaced apart in the Y axis direction and have different lengths. Of the four first divided line overlapping portions 442aS, two of the first divided line overlapping portions 442aS that are adjacent to the source inspection circuit 433 in the Y axis direction are relatively short and cover the leading lines 430 and 436 that are located adjacent to the outer ends in the X axis direction as short-circuit targets. In contrast, two of the first divided line overlapping portions 442aS that are adjacent to the display area AA in the Y axis direction are relatively long and cover the leading lines 430 and 436 that are located at the middle in the X axis direction as short-circuit targets. Of the four second divided line overlapping portions 442bS, two of the second divided line overlapping portions 442bs that are adjacent to the terminals 431 and 437 in the Y axis direction are relatively short and cover the source leading lines 430 that are located adjacent to the outer ends in the X axis direction and all the touch leading lines 436 as short-circuit targets. In contrast, two of the second divided line overlapping portions 442bS that are away from the terminals 431 and 437 in the Y axis direction are relatively long and cover the source leading lines 430 that are located at the middle in the X axis direction. The number of overlap-to-overlap connecting portions 442c is two, i.e., half of the number of divided sections of the line overlapping portions 442a or 442b. The two overlap-to-overlap connecting portions 442c are not located at the middle of the array substrate 410b in the X axis direction and are located adjacent to the outer ends in the X axis direction. The overlap-to-overlap connecting portion 442c partly overlaps (intersect) the ends of the divided line overlapping portions 442aS and 442bS. Specifically described, the overlap-to-overlap connecting portion 442c on the left in FIG. 12 partly overlaps the end portions of the four divided line overlapping portions 442aS and 442bS on the left in FIG. 12, and the overlap-to-overlap connecting portion 442c on the right in FIG. 12 partly overlaps the ends of the four divided line overlapping portions 442aS and 442bS on the right in FIG. 12.

To connect one of the leading lines 430 and 436 to the spare line 442, one of the end portions 430a, 430b, 436a, and 436b is short-circuited to one of the divided line overlapping portions 442a and 442b of the line overlapping portions 442a and 442b by laser irradiation, for example, and one of the four divided line overlapping portions 442aS and the four divided line overlapping portions 442bS, which are formed of the first metal film, is short-circuited to the overlap-to-overlap connecting portion 442c, which is formed of the third metal film, by laser irradiation, for example. Here, this configuration requires a smaller number of overlap-to-overlap connecting portions 442c and a smaller arrangement space for overlap-to-overlap connecting portions 442c than the configuration of the first embodiment in which the overlap-to-overlap connecting portion 42c is formed of the first metal film 18 and the number of overlap-to-overlap connecting portions 42c is required to be the same as that of the divided line overlapping portions 42aS and 42bS. Thus, this configuration is advantageous for higher definition and a smaller frame width. An inter-line pad formed of the second metal film may be disposed at a position where one of the divided line overlapping portions 442aS and 442bS, which are formed of the first metal film, is short-circuited to the overlap-to-overlap connecting portion 442c, which is formed of the third metal film.

As illustrated in FIG. 12, the leading lines 430 and 436 that are located relatively close to the overlap-to-overlap connecting portions 442c have shorter extended portions 432 and 438 at the second end portions 430b and 436b, and the source leading lines 430 that are located relatively away from the overlap-to-overlap portions 442c have longer extended portions 432 at the second end portions 430b and 436b. Of the two longer second divided line overlapping portions 442bS and the two shorter second divided line overlapping portions 442bS, the shorter second divided line overlapping portions 442bS overlap only the shorter extended portions 432 and 438 and the longer divided line overlapping portions 442bS selectively overlap only the longer source extended portions 432. In other words, four second divided line overlapping portions 442bS of the spare line 442 includes two second divided line overlapping portions 442bS selectively overlapping the shorter extended portions 432 and 438 and two second divided line overlapping portions 442bS selectively overlapping the longer source extended portions 432. In this configuration, the second divided line overlapping portions 442bS that overlap the shorter extended portions 432 and 438 do not overlap the longer source extended portions 432, and the second divided line overlapping portions 442b that overlap the longer source extended portions 432 do not overlap the shorter extended portions 432 and 438. This reduces parasitic capacitance between the leading lines 430 and 436 not to be short-circuited and the second divided line overlapping portions 442bS, reducing load to the source lines 414 and the touch lines 417.

Figure 13:
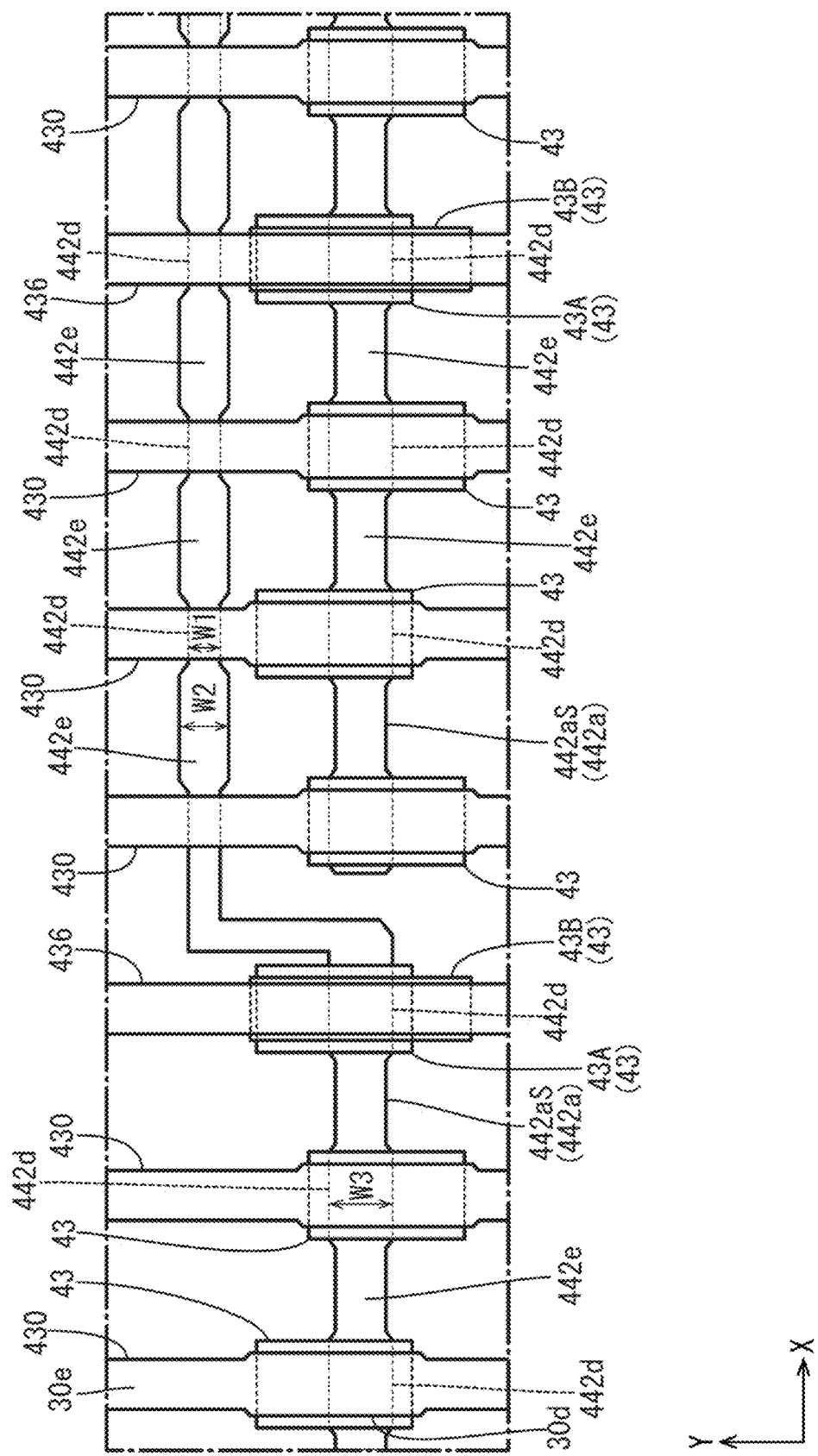
FIG. 13 is a plan view illustrating overlapping portions where the source leading lines and the touch leading lines overlap the spare line.

As illustrated in FIG. 13, the spare line 442 is configured such that the width of the longer first divided line overlapping portions 442aS varies depending on the positions relative to the first end portions 430a and 436a of the leading line 430 and 436. Specifically described, the longer first divided line overlapping portion 442aS has a first section that covers the first end portions 430a and 436a of the leading lines 430 and 436 that are located relatively away from the overlap-to-overlap connecting portion 443c as short-circuit targets and a second section that overlaps the first end portions 430a and 436a of the leading lines 430 and 436 that are not covered as short-circuit targets. The second section extends from the first section to the overlap-to-overlap connecting portion 443c. The width W1 of overlapping portions 442d where the longer first divided line overlapping portion 442aS overlaps the first end portions 430a and 436a of the leading lines 430 and 436 that are not covered as short-circuit targets is smaller than the width W2 of non-overlapping portions 442e and the width W3 of overlapping portions 442d where the longer first divided line overlapping portion 442aS overlaps the first end portions 430a and 436a of the leading lines 430 and 436 that are covered as short-circuit targets. In this configuration, the first divided line overlapping portions 442aS, which cover the first end portions 430a and 436a of the leading lines 430 and 436 that are located relatively away from the overlap-to-overlap connecting portion 443c as short-circuit targets, overlap the first end portions 430a and 436a of the leading lines 430 and 436 that are located relatively close to the overlap-to-overlap connecting portion 443c. However, the overlapping portions 442d thereof have the width W1 smaller than the width W3 of the overlapping portions 442d where the first divided line overlapping portion 442aS overlaps the first end portions 430a and 436a of the leading lines 430 and 436 covered as short-circuit targets. This configuration reduces parasitic capacitance between the leading lines 430 and 436 not to be short-circuited and the first divided line overlapping portion 442aS. This reduces load to the source lines 414 and the touch lines 417.

As described above, in this embodiment, the first and second line overlapping portions 442a and 442b of the spare line 442, respectively, include the divided line overlapping portions 442aS and 442bS covering different sets of the source leading lines 430 as short-circuit targets. The spare line 442 includes the overlap-to-overlap connecting portion 442c formed of the third metal film and partly overlapping the divided line overlapping portions 442aS and 442bS that overlap the first end portions 430a of the source leading lines 430 and the divided line overlapping portions 442aS and 442bS that overlap the second end portions 430b of the source leading lines 430. In this configuration, to connect the source leading line 430 to the spare line 442, the end portions 430a and 430b are short-circuited to the divided line overlapping portions 442aS and 442bS of the line overlapping portions 442a and 442b by laser irradiation, for example, and the divided line overlapping portions 442aS and 442bS formed of the first metal film are short-circuited to the overlap-to-overlap connecting portion 442c formed of the third metal film by laser irradiation, for example. This configuration requires the smaller number of overlap-to-overlap connecting portions 442c and the smaller arrangement space for overlap-to-overlap connecting portions 442c than a configuration in which the overlap-to-overlap connecting portion is formed of the first metal film and the number of overlap-to-overlap connecting portions 442c is required to be the same as that of the divided line overlapping portions 442aS and 442bS. This configuration is advantageous for higher definition and a smaller frame width.

Furthermore, the second end portions 430b of the source leading lines 430 each include the source terminal 431 through which a signal enters and the source extended portion (extended portion) 432 extending from the source terminal 431 to a side away from the source line 414. The source extended portion 432 of the source leading lines 430 that are located relatively close to the overlap-to-overlap connecting portion 442c are shorter than the source extended portion 432 of the source leading lines 430 that are located relatively away from the overlap-to-overlap connecting portion 442c. The divided line overlapping portions 442aS and 442bS of the spare line 442 include divided line overlapping portions selectively overlapping the shorter source extended portions 432 and divided line overlapping portions selectively overlapping the longer source extended portions 432. In this configuration, the source leading lines 430 that are located relatively close to the overlap-to-overlap connecting portion 442c have the shorter source extended portions 432, which extend from the source terminals 431 to a side away from the source lines 414, than the source leading lines 430 that are located relatively away from the overlap-to-overlap connecting portion 442c. This prevents the divided line overlapping portions 442aS and 442bS overlapping the shorter source extended portions 432 from overlapping the longer source extended portions 432 and also prevents the divided line overlapping portions 442aS and 442bS overlapping the longer source extended portions 432 from overlapping the shorter source extended portions 432. This configuration reduces parasitic capacitance between the source leading lines 430 not covered as short-circuit targets and the divided line overlapping portion 442aS and 442bS, reducing load to the source lines 414 and the touch lines 417.

Furthermore, the first divided line overlapping portions 442aS of the spare line 442 include the first divided line overlapping portion 442aS that covers the first end portions 430a and 436a of the leading lines 430 and 436 that are located relatively away from the overlap-to-overlap connecting portion 443c as short-circuit targets. The first divided line overlapping portion 442aS has a first section having overlapping portions overlapping the first end portions 430a and 436a of the leading lines 430 and 436 that are covered as the short-circuit targets and a second section having overlapping portions overlapping the first end portions 430a and 436a of the leading lines 430 and 436 that are located relatively close to the overlap-to-overlap connecting portion 443c. The overlapping portions of the second section have the width W1 smaller than the width W2 of the overlapping portions of the first section. In this configuration, although the first divided line overlapping portion 442aS that covers the first end portions 430a and 436a of the leading lines 430 and 436 that are located relatively away from the overlap-to-overlap connecting portion 443c as short-circuit targets overlaps the first end portions 430a and 436a of the leading lines 430 and 436 that are located relatively close to the overlap-to-overlap connecting portion 443c, the overlapping portions 442d have the width W1 smaller than the width W3 of the overlapping portion 442d overlapping the first end portions 430a and 436a of the short-circuit target leading lines 430 and 436. This reduces parasitic capacitance between the leading lines 430 and 436 not to be short-circuited and the first divided line overlapping portion 442aS. This further reduces load to the source lines 414 and the touch lines 417.

Other Embodiments

The present invention is not limited to the embodiments described above and illustrated by the drawings. For example, the following embodiments are included in the technical scope of the present invention.

(1) In the above embodiments, the second end portions of the leading lines have the terminals and the extended portions. However, the extended portions may be eliminated. In such a case, the terminals are formed of the third metal film and the second line overlapping portion of the spare line overlaps the terminals.

(2) In the above embodiments, the line overlapping portions of the spare line are each divided into four or two sections. However, the line overlapping portions may be divided into three or five or more sections.

(3) In the above embodiments, the line overlapping portions of the spare line are each divided into multiple sections. However, the line overlapping portions each may have a non-divided single section.

(4) In the above embodiments, the first and second line overlapping portions of the spare line are connected to each other by the overlap-to-overlap connecting portion. However, the first and second line overlapping portions may be directly connected to each other without the overlap-to-overlap connecting portion.

(5) In the above embodiments, the terminals are each formed of the second metal film. However, the terminals may be formed of a metal film other than the second metal film or may be formed of a transparent electrode film. In such a case, the terminal may have a laminated structure including multiple metal films or a laminated structure including a metal film and a transparent electrode may be employed.

(6) In the above embodiments, the number of source leading lines is the same as the number of source lines. However, an RGB switching circuit that sorts image signals by color may be disposed between the source line and the source leading lines, for example, to reduce the number of source leading lines to about a third of the number of source lines.

(7) In the above embodiments, the wiring marks are formed of the first metal film. However, the wiring marks may be formed of a metal film other than the first metal film.

(8) In the above embodiments, one driver is disposed in the non-display area of the array substrate. However, the number of drivers may be two or more.

(9) In the above embodiments, the driver is mounted on the array substrate by using chip on glass (COG) technology. However, the driver may be mounted on the flexible board by using chip on film (COF) technology. In such a case, the source terminals or the touch terminals overlap the flexible board.

(10) The above embodiments include the driver for both image display signals and touch detection signals. However, a specialized driver for image display signals and a specialized driver for touch detection signals may be separately disposed.

(11) In the above embodiments, the end portions of the leading lines are formed of the third metal film and the fourth metal film and the first and second line overlapping portions of the spare line are formed of the first metal film. However, the end portions of the leading lines may be formed of the first metal film and the first and second line overlapping portions of the spare line may be formed of the third metal film and the fourth metal film.

(12) The route (wiring route) and the number of the leading lines or the spare line, the arrangement and the number of the terminals or the extended portions, and the arrangement and the number of the inspection circuits may be suitably changed from those illustrated in the above embodiments.

(13) The technical matters described in the above embodiments may be suitably combined.

(14) The semiconducting film constituting the channel portion of the TFT may be polysilicon other than the semiconducting film described in the above embodiments. In such a case, the TFT is preferably a bottom gate TFT.

(15) In the above embodiments, the touch panel pattern is a self-capacitive touch panel pattern. However, the present invention is applicable to a mutual capacitive touch panel pattern.

(16) In the above embodiments, the liquid crystal panel is an in-cell liquid crystal panel including a built-in touch panel pattern. However, the liquid crystal panel may be an on-cell liquid crystal panel having a touch panel pattern on an outer surface of one of the two substrates. Furthermore, the liquid crystal panel may be an out-cell liquid crystal panel having a touch panel pattern in a touch panel independent of the liquid crystal panel. Furthermore, the liquid crystal panel may be a liquid crystal panel not having a touch panel function.

(17) In the above embodiments, the liquid crystal panel is a transmissive liquid crystal panel. However, the present invention is applicable to a reflective liquid crystal panel and a semi-transmissive liquid crystal panel.

(18) In the above embodiments, the liquid crystal display device (the liquid crystal panel and the backlight device) has a vertically long rectangular shape in a plan view. However, the liquid crystal display device may have a horizontally long rectangular, square, circular, semi-circular, oval, elliptical, or trapezoid shape in a plan view, for example.

(19) In the above embodiments, the liquid crystal panel includes a liquid crystal layer sandwiched between the substrates. However, the present invention is applicable to a liquid crystal panel including functional organic molecules, other than the liquid crystal material, sandwiched between the substrates.

(20) In the above fifth embodiment, the overlap-to-overlap connecting portion of the spare line is formed of the third metal film. However, the overlap-to-overlap connecting portion may be formed of the second metal film.

EXPLANATION OF SYMBOLS

10: liquid crystal panel (display device)
10a: CF substrate (counter substrate)
10b, 410b: array substrate (wiring substrate)
10d: sealing portion
11, 211, 311, 411: driver
14, 214, 414: source line (signal line)
16: touch electrode (position detection electrode)
17, 317, 417: touch line (position detection line)
18: first metal film (first conductive film)
19: first interlayer insulating film (first insulating film)
20: second metal film (second conductive film)
21: second interlayer insulating film (second insulating film)
22: third metal film (third conductive film)
23: third interlayer insulating film (third insulating film)
24: fourth metal film (fourth conductive film)
25: fourth interlayer insulating film (fourth insulating film)
26: second transparent electrode film (transparent electrode film)
30, 130, 230, 330, 430: source leading line (leading line)
30a, 430a: first end portion (first end portion)
30b, 230b, 430b: second end portion (second end portion)
30c: middle portion
31, 231, 431: source terminal (terminal)
32, 232, 432: source extended portion (extended portion, inspection circuit connecting portion)
33, 233, 433: source inspection circuit (inspection circuit)
36, 136, 336, 436: touch leading line (position detection leading line)
36a, 436a: first end portion (first end portion)
36b, 336b, 436b: second end portion (second end portion)
42, 142, 442: spare line
42a, 142a, 442a: first line overlapping portion (line overlapping portion)
42aS, 142aS, 442aS: first divided line overlapping portion (divided line overlapping portion)
42b, 142b, 442b: second line overlapping portion (line overlapping portion)
42bS, 142bS, 442bS: second divided line overlapping portion (divided line overlapping portion)
42c, 142c, 442c: overlap-to-overlap connecting portion
42d, 442d: overlapping portion
43: inter-line pad
43a: leading line overlapping portion
43b: spare line overlapping portion
IS: inner space

The invention claimed is:

1. A wiring substrate comprising:
a first conductive film;
a second conductive film disposed over the first conductive film with a first insulating film therebetween;
a third conductive film disposed over the second conductive film, at a side away from the first conductive film, with a second insulating film therebetween;
signal lines formed of the third conductive film;
leading lines each having a first end portion connected to the signal line and a second end portion through which a signal to the signal line enters, the first and second end portions of the leading lines at least being formed of the third conductive film; and
a spare line including at least first and second line overlapping portions, respectively, overlapping the first and second end portions of the leading lines, the first and second line overlapping portions being formed of the first conductive film and allow electrically connection to each other.

2. The wiring substrate according to claim 1, further comprising an inter-line pad overlapping the first and second end portions of the leading lines and the first and second line overlapping portions of the spare line, the inter-line pad being formed of the second conductive film.

3. The wiring substrate according to claim 2, wherein the inter-line pad has leading line overlapping portions overlapping the first and second end portions of the leading lines and spare line overlapping portions overlapping the first and second line overlapping portions of the spare line.

4. The wiring substrate according to claim 3, wherein the spare line overlapping portions of the inter-line pad overlap the first, and second end portions of the leading lines and the leading line overlapping portions thereof do not overlap the first and second line overlapping portions.

5. The wiring substrate according to claim 1, further comprising:
a fourth conductive film disposed over the third conductive film, at a side away from the second conductive film, with a third insulating film therebetween;
a transparent electrode film disposed over the fourth conductive film, at a side away from the third conductive film, with a fourth insulating film therebetween;

a position detection electrode configured to form capacitance with a position input body that inputs a position to enable detection of a position inputted by the position input body, the position detection electrode being formed of the transparent electrode film;

position detection lines extending along the signal lines and connected to the position detection electrode through contact holes at least in the fourth insulating film, the position detection lines being formed of the fourth conductive film; and position detection leading lines each having a first end portion connected to the position detection line and a second end portion through which a signal to the position detection lines enters, the first and second end portions of the position detection leading lines at least being formed of at least one of the third conductive film and the fourth conductive film, wherein the first and second line overlapping portions of the spare line, respectively, overlap the first and second end portions of the detection leading lines.

6. The wiring substrate according to claim 1, wherein the first and second line overlapping portions of the spare line each include divided line overlapping portions covering different sets of the leading lines as short-circuit targets, the divided line overlapping portions that overlap the first end portions of the leading lines allow electrically connection to the corresponding divided line overlapping portions that overlap the second end portions of the leading lines.

7. The wiring substrate according to claim 1, wherein the leading lines each have a middle portion not overlapping the spare line and the middle portion is formed of any one of the first conductive film, the second conductive film, and the third conductive film, and the middle portions of the leading lines located next to each other are formed of different conductive films.

8. The wiring substrate according to claim 7, wherein the second end portions of the leading lines each include a terminal through which a signal enters, and the terminal is formed of the second conductive film.

9. The wiring substrate according to claim 1, further comprising an inspection circuit for inspecting the signal lines, wherein the second end portions of the signal lines each include a terminal through which a signal enters and an inspection circuit connecting portion extending from the terminal to a side away from the signal line and connected to the inspection circuit.

10. The wiring substrate according to claim 9, further comprising a driver overlapping the terminals and connected to the terminals, wherein the inspection circuit overlaps the driver.

11. The wiring substrate according to claim 1, wherein the spare line includes an overlap-to-overlap connecting portion extending from one of the first and second line overlapping portions to the other and formed of the first conductive film.

12. The wiring substrate according to claim 1, wherein the first and second line overlapping portions of the spare line each include divided line overlapping portions covering different sets of the leading lines as short-circuit targets, and the spare line includes an overlap-to-overlap connecting portion formed of the second conductive film or the third conductive film and partly overlapping the divided line overlapping portions that overlap the first end portions of the leading lines and the divided line overlapping portions that overlap the second end portions of the leading lines.

13. The wiring substrate according to claim 12, wherein the second end portions of the leading lines each include a terminal through which a signal enters and an extended portion extending from the terminal to a side away from the signal line, and the extended portions of the leading lines that are located relatively close to the overlap-to-overlap connecting portion are shorter than the extended portions of the leading lines that are located relatively away from the overlap-to-overlap connecting portion, and the divided line overlapping portions of the spare line include a divided line overlapping portion selectively overlapping the shorter extended portions and a divided line overlapping portion selectively overlapping the longer extended portions.

14. The wiring substrate according to claim 12, wherein the divided line overlapping portions of the spare line include a divided line overlapping portion that covers the first end portions of the leading lines that are located relatively away from the overlap-to-overlap connecting portion as short-circuit targets, the divided line overlapping portion has a first section having overlapping portions overlapping the first end portions of the leading lines that are covered as the short-circuit targets and has a second section having overlapping portions overlapping the first end portions of the leading lines that are located relatively close to the overlap-to-overlap connecting portion, and the overlapping portions of the second section have a smaller width than the overlapping portions of the first section.

15. A display device comprising:
the wiring substrate according to claim 1;
a counter substrate having a plate surface facing a plate surface of the wiring substrate with a space therebetween; and
a sealing portion disposed between the wiring substrate and the counter substrate and surrounding the space, wherein the leading lines at least partly overlap the sealing portion.

* * * * *